United States Patent [10] Patent No.: US 10,404,189 B2
Ishibashi et al. [45] Date of Patent: Sep. 3, 2019

(54) SWITCHING OUTPUT CIRCUIT

(71) Applicant: NEC Corporation, Tokyo (JP)

(72) Inventors: Osamu Ishibashi, Tokyo (JP);
Kazuhisa Sunaga, Tokyo (JP);
Atsumasa Sawada, Tokyo (JP);
Hideyuki Sugita, Tokyo (JP); Ayami
Tanabe, Tokyo (JP)

(73) Assignee: NEC Corporation, Tokyo (JP)

(*) Notice: Subject to any disclaimer, the term of this patent is extended or adjusted under 35 U.S.C. 154(b) by 0 days.

(21) Appl. No.: 15/319,445

(22) PCT Filed: Jun. 15, 2015

(86) PCT No.: PCT/JP2015/002979
§ 371 (c)(1),
(2) Date: Dec. 16, 2016

(87) PCT Pub. No.: WO2015/194153
PCT Pub. Date: Dec. 23, 2015

(65) Prior Publication Data
US 2017/0141700 A1 May 18, 2017

(30) Foreign Application Priority Data
Jun. 18, 2014 (JP) ................. 2014-124980

(51) Int. Cl.
*H02M 7/5395* (2006.01)
*H02M 7/48* (2007.01)
(Continued)

(52) U.S. Cl.
CPC .......... *H02M 7/5395* (2013.01); *H02M 7/48* (2013.01); *H02M 7/5387* (2013.01);
(Continued)

(58) Field of Classification Search
CPC ............ H02M 7/00; H02M 7/42; H02M 7/44; H02M 7/48; H02M 7/53; H02M 7/537;
(Continued)

(56) References Cited

U.S. PATENT DOCUMENTS 5,287,260 A * 2/1994 Uchino ............... H02M 5/4505
363/129
2009/0195235 A1 8/2009 Stoltz
(Continued)

FOREIGN PATENT DOCUMENTS

EP 2073368 A1 6/2009
JP 2008-092745 A 4/2008
(Continued)

OTHER PUBLICATIONS

International Search Report corresponding to PCT/JP2015/002979, 1 page, dated Aug. 25, 2015.
(Continued)

*Primary Examiner* — Gary L Laxton
*Assistant Examiner* — Carlos O Rivera-Perez
(74) *Attorney, Agent, or Firm* — Wilmer Cutler Pickering Hale and Dorr LLP

(57) ABSTRACT

A switching output circuit is provided that enables an accurate control of output power. To achieve the objective, a switching output circuit according to an exemplary aspect of the present invention includes eight switching means, two electric storage means, and a control means, wherein the control means controls the switching means and switches a conduction state and a non-conduction state, by which the power supplied from a direct-current power supply is switched and supplied to an inductive load.

16 Claims, 18 Drawing Sheets

(51) Int. Cl.
*H02M 7/5387* (2007.01)
*H03K 17/16* (2006.01)
*H02M 1/00* (2006.01)
*H02M 1/34* (2007.01)

(52) U.S. Cl.
CPC ... *H03K 17/162* (2013.01); *H02M 2001/0058* (2013.01); *H02M 2001/342* (2013.01); *Y02B 70/1491* (2013.01)

(58) Field of Classification Search
CPC .......... H02M 7/5387; H02M 7/53871; H02M 7/53873; H02M 7/53875; H02M 7/5388; H02M 7/539; H02M 7/5395; H02M 7/797; H02M 7/483; H02M 3/00; H02M 3/02; H02M 3/04; H02M 3/06; H02M 3/07; H02M 3/073; H02M 2001/0009; H02M 2001/0048; H02M 2001/0054; H02M 2001/0058; H02M 1/32; H02M 1/34; H02M 1/44; H02M 2007/4815; H02M 2007/4818; H02M 2007/4835; H02M 2007/49; H02M 2001/342; H05B 6/00; H05B 6/02; H05B 6/04; H05B 6/06; H03K 17/162; Y02B 70/1416; Y02B 70/1441; Y02B 70/1491
USPC ................ 323/205–211, 222–226, 239, 252, 323/271–277, 282–285, 311, 312, 351; 363/15–17, 21.02, 21.03, 35, 40–43, 363/50–56.12, 95–98, 123–127, 131–134; 219/660, 661, 663, 665, 668, 671
See application file for complete search history.

(56) References Cited

U.S. PATENT DOCUMENTS

| | | |
|---|---|---|
| 2010/0014333 A1 | 1/2010 | Shimada et al. |
| 2013/0010507 A1* | 1/2013 | Kitahara ............... H02M 3/158 363/56.03 |
| 2013/0314965 A1* | 11/2013 | Shinohara ........... H02M 7/5387 363/132 |

FOREIGN PATENT DOCUMENTS

| | | |
|---|---|---|
| JP | 2011-508572 A | 3/2011 |
| WO | WO-2009/086445 A1 | 7/2009 |

OTHER PUBLICATIONS

Written Opinion of International Searching Authority corresponding to PCT/JP2015/002979 with English translation, 4 pages, dated Aug. 25, 2015.

* cited by examiner

SWITCHING OUTPUT CIRCUIT

CROSS-REFERENCE TO RELATED APPLICATIONS

This application is a national stage application of International Application No. PCT/JP2015/002979 entitled "SWITCHING OUTPUT CIRCUIT," filed on Jun. 15, 2015, which claims the benefit of the priority of Japanese Patent Application No. 2014-124980 filed on Jun. 18, 2014, the disclosures of each of which are hereby incorporated by reference in their entirety.

TECHNICAL FIELD

The present invention relates to switching output circuits, in particular, to a switching output circuit to supply electric power to a resistive load having parasitic inductance.

BACKGROUND ART

When supplying electric power to a resistive load having parasitic inductance, a pulse width modulation (PWM) control is used that switches output voltage by means of a semiconductor switch. When the semiconductor switch in such a switching output circuit switches from a conduction state to a non-conduction state, surge voltage arises that is caused by release of electromagnetic energy accumulated in the parasitic inductance. The surge voltage causes a breakdown of the semiconductor switch.

In order to prevent the breakdown of the semiconductor switch due to the surge voltage, a snubber circuit is often used that absorbs the electromagnetic energy accumulated in the parasitic inductance of the resistive load. A switching output circuit in which a snubber circuit is placed is described in Patent Literature 1, for example. FIG. 16 illustrates a circuit block diagram of the switching output circuit by Patent Literature 1.

In a switching output circuit 900 in FIG. 16, when semiconductor switches SW1 to SW4 in a switching unit 910 are in the off position, a capacitor C is charged up to the voltage of a direct-current power supply 930 at the polarity that its terminal connected to a smoothing coil 940 has positive polarity. When semiconductor switches SW1 and SW3 turn ON under this condition, a current flows in a path of capacitor C→semiconductor switch SW1→load 920→semiconductor switch SW3→capacitor C, so that the charge in the capacitor C is discharged to the load 920.

When the charge in the capacitor C is discharged and the voltage becomes zero, the diodes in the semiconductor switches SW2 and SW4 turn ON automatically. This makes the current keep flowing circulating through all the semiconductor switches SW1 to SW4. The current flowing through the load 920 attenuates due to an equivalent resistance R of the load 920.

Next, when all the semiconductor switches SW1 to SW4 are turned off, the capacitor C is charged with the current flowing through the load 920 via the diodes in the semiconductor switches SW2 and SW4. The voltage of the capacitor C increases until the current comes to a stop. The electromagnetic energy has transferred from the load 920 to the capacitor C at the time of the stop of the current. At this time, the terminal of the capacitor C that is connected to the smoothing coil 940 has positive polarity, which is the same all the time regardless of the direction of the current flowing through the load 920.

Because the resonant frequency by the electrostatic capacitance C of the capacitor C and the inductance L of the load 920 is made higher than the frequency of the alternating pulsed current that arises, the semiconductor switches SW1 to SW4 perform a zero-voltage-switching and a zero-current-switching. That is to say, the circuit is configured to regenerate the electromagnetic energy of the load 920 and generate an alternating pulsed current in the load 920.

CITATION LIST

Patent Literature

[PTL 1] Japanese Unexamined Patent Application Publication No. 2008-092745

SUMMARY OF INVENTION

Technical Problem

However, if the charge in the capacitor C is discharged to the load 920 turning on the semiconductor switches SW1 and SW3 in the switching output circuit 900 illustrated in FIG. 16, it could be that the output current cannot be supplied sufficiently on the leading edge due to the inductance L of the load 920. In this case, the leading edge of the output current deteriorates, which makes it difficult to perform accurate control during the PWM control.

The present invention has been achieved taking into account the above-described problems, and the object of the present invention is to provide a switching output circuit that has an excellent leading edge of the output current and can control the output power with a high degree of accuracy.

Solution to Problem

In order to achieve the above-described object, a switching output circuit according to an exemplary aspect of the present invention includes eight switching means, two electric storage means, and a control means, and switches power supplied from a direct-current power supply and supplies the power to an inductive load. Here, each one end of first, second, third, and fourth switching means is connected to a positive terminal of the direct-current power supply, and each other end of fifth, sixth, seventh, and eighth switching means is connected to a negative terminal of the direct-current power supply; the other end of the first switching means and one end of the fifth switching means are connected to one end of the inductive load, and the other end of the third switching means and one end of the seventh switching means are connected to the other end of the inductive load; the other end of the second switching means and one end of the sixth switching means are connected to one end of the inductive load through the first electric storage means, and the other end of the fourth switching means and one end of the eighth switching means are connected to the other end of the inductive load through the second electric storage means. The control means controls the first to the eighth switching means and switches a conduction state and a non-conduction state.

Advantageous Effects of Invention

According to the above-mentioned aspects of the present invention, a switching output circuit can be provided that enables accurate control of the output power.

EXAMPLE EMBODIMENT

<A First Example Embodiment>

A first example embodiment in accordance with the present invention will be described. A switching output circuit in accordance with the present example embodiment will be described using FIG. 1.

Figure 1:
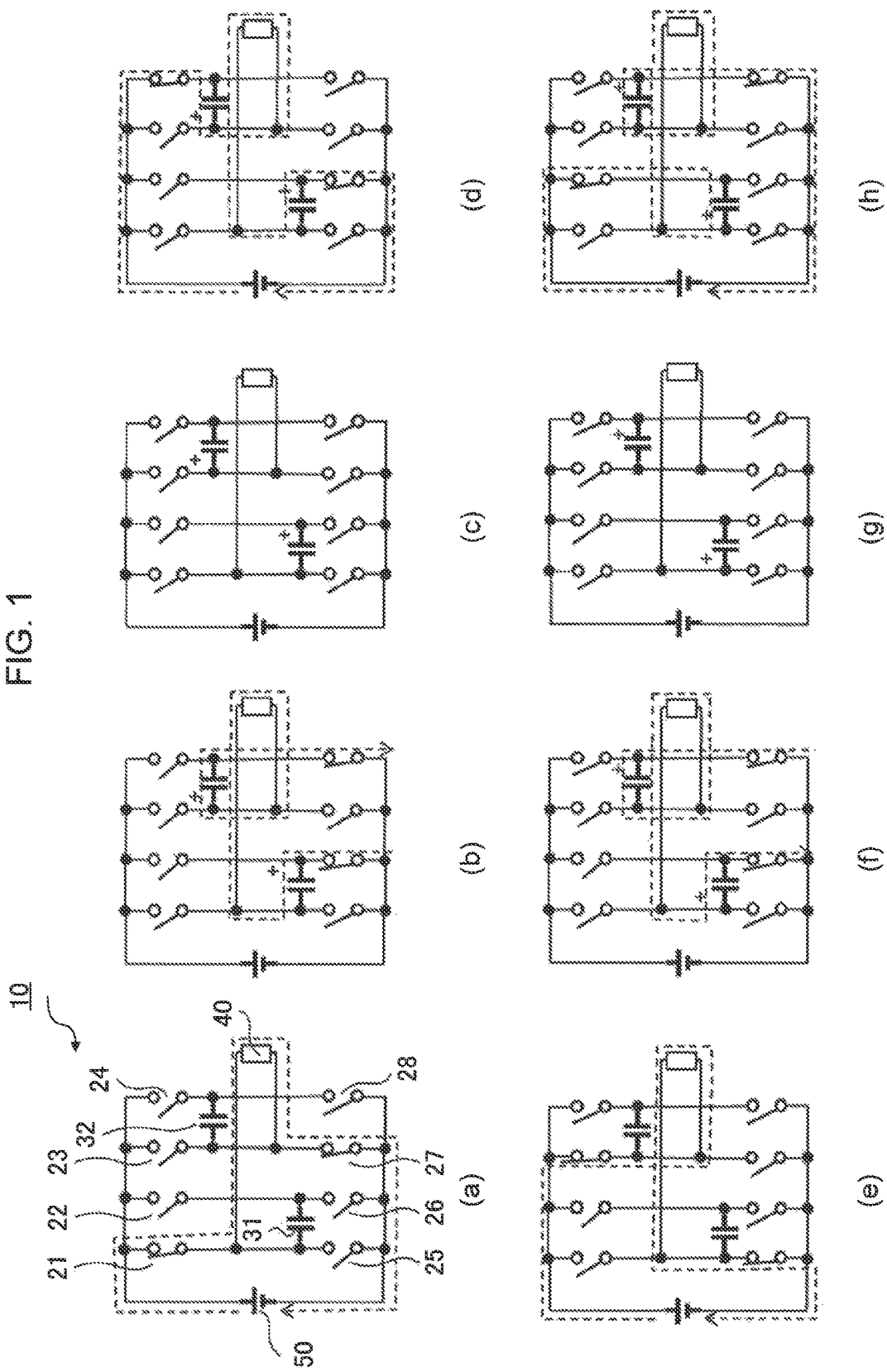
FIG. 1 is a diagram illustrating an operation procedure of a switching output circuit 10 in accordance with a first exemplary embodiment.

First, the configuration of the switching output circuit 10 in accordance with the present example embodiment will be described. As illustrated in FIG. 1, the switching output circuit 10 includes eight switching members 21 to 28, two electric storage members 31 and 32, and a control circuit that is not shown in the figure. The switching output circuit 10 switches power supplied through a direct-current power supply 50 and supplies the power to an inductive load 40.

Each one end of a first switching member 21, a second switching member 22, a third switching member 23, and a fourth switching member 24 is connected to the positive terminal of the direct-current power supply 50, and each other end of a fifth switching member 25, a sixth switching member 26, a seventh switching member 27, and an eighth switching member 28 is connected to the negative terminal of the direct-current power supply 50. The other end of the first switching member 21 and one end of the fifth switching member 25 are connected to one end of the inductive load 40, and the other end of the third switching member 23 and one end of the seventh switching member 27 are connected to the other end of the inductive load 40. In addition, the other end of the second switching member 22 and one end of the sixth switching member 26 are connected to one end of the inductive load 40 through the first electric storage member 31, and the other end of the fourth switching member 24 and one end of the eighth switching member 28 are connected to the other end of the inductive load 40 through the second electric storage member 32.

The electric storage members 31 and 32 absorb surge voltage that is caused by release of electromagnetic energy accumulated in the inductive load 40.

The control circuit switches the first switching member 21, the third switching member 23, the fifth switching member 25, and the seventh switching member 27, and thereby the voltage of the direct-current power supply 50 is alternately output to the inductive load 40 (hereinafter, referred to as switching output operation). Additionally, the control circuit switches the second switching member 22, the fourth switching member 24, the sixth switching member 26, and the eighth switching member 28, and thereby the electric storage members 31 and 32 recover the electromagnetic energy accumulated in the inductive load 40, and then the recovered electromagnetic energy is added to the inductive load 40.

Specifically, first of all, as a first control, the control circuit makes conduction states the first switching member 21 and the seventh switching member 27, or the third switching member 23 and the fifth switching member 25, with making the other switching members non-conduction states. This makes a current flow as indicated by dotted arrowed lines in (a) and (e) in FIG. 1, and the electromagnetic energy is accumulated in the inductive load 40.

Next, as a second control, the control circuit makes conduction states the sixth switching member 26 and the eighth switching member 28, with making the other switching members non-conduction states. This makes a current flow as indicated by dotted arrowed lines in (b) and (f) in FIG. 1, and the electric storage members 31 and 32 recover the electromagnetic energy released from the inductive load 40.

In addition, as a third control, the control circuit makes all the switching members 21 to 28 non-conduction states after all the electromagnetic energy released from the inductive load 40 has been recovered by the electric storage members 31 and 32. This makes the electromagnetic energy retained in the electric storage members 31 and 32.

As a fourth control, the control circuit makes the fourth switching member 24 and the sixth switching member 26 conduction states, or makes the second switching member 22 and the eighth switching member 28 conduction states, with making the other switching members non-conduction states. This makes the electric storage members 31 and 32, the inductive load 40, and the direct-current power supply 50 connected in series, and makes it possible to supply the inductive load 40 with a voltage obtained by adding the voltages of the electric storage members 31 and 32 to the voltage from the direct-current power supply 50.

That is to say, all the electromagnetic energy accumulated in the inductive load 40 during the switching output operation time is temporarily recovered into the electric storage members 31 and 32, and the recovered electromagnetic energy is supplied to the inductive load 40 during the next switching output operation time. In this case, it is possible to regenerate efficiently the electromagnetic energy accumulated in the inductive load 40 and improve the leading edge/trailing edge of the output voltage during the switching output operation time. Consequently, the switching output circuit 10 in accordance with the present exemplary embodiment can accurately control the output power during the PMW control.

<A Second Exemplary Embodiment>

Figure 2:
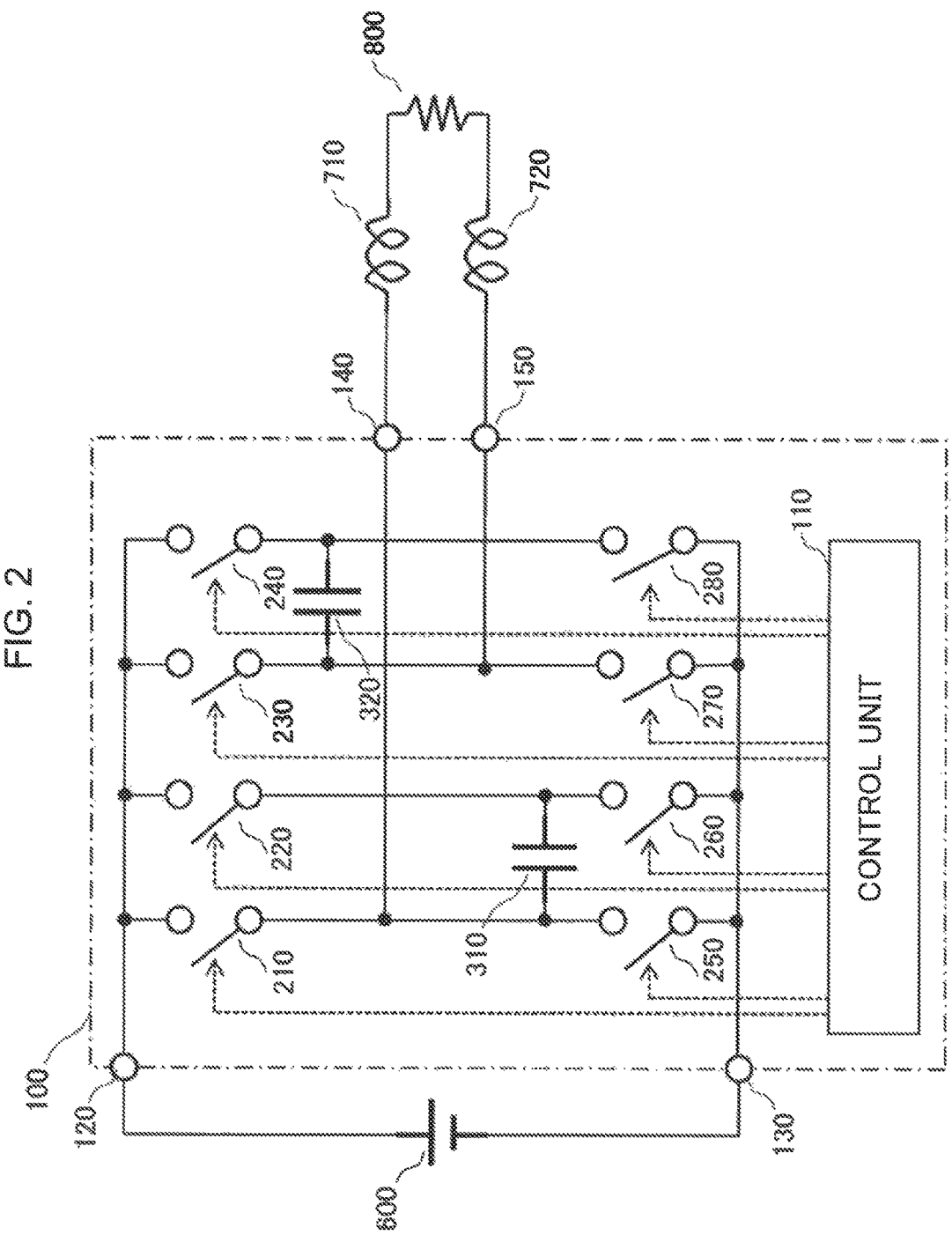
FIG. 2 is a circuit block diagram of a switching output circuit 100 in accordance with a second exemplary embodiment.

A second exemplary embodiment will be explained. In the present exemplary embodiment, a switching output circuit will be described that is used in a power supply to supply electric power in the form of PWM output for a resistive load such as a heater. FIG. 2 illustrates a circuit block diagram of a switching output circuit in accordance with the present exemplary embodiment. A switching output circuit 100 in accordance with the present exemplary embodiment switches power supplied through a direct-current power supply 600 and supplies the power to two parasitic inductances 710, 720 and a load resistance 800. Although the two parasitic inductances 710 and 720 are disposed in the present exemplary embodiment, the number of the parasitic inductances is not limited to two, and it may be one, or three or more. Similarly, the number of the direct-current power supply 600 and the load resistance 800 may be two or more.

The switching output circuit 100 is configured by eight semiconductor switches 210 to 280 and two capacitors 310 and 320, and further includes a control unit 110, input terminals 120 and 130, and output terminals 140 and 150.

Each of the capacitors 310 and 320 absorbs surge voltage. The surge voltage is a voltage that is generated in association with the release, from the parasitic inductances 710 and 720, of the electromagnetic energy accumulated in the parasitic inductances 710 and 720 due to a current flowing through them.

The semiconductor switches 210, 230, 250, and 270 compose a bridge-connection switching circuit, switch their conduction states and non-conduction states, and thereby alternately output the voltage of the direct-current power supply 600 to the load resistance 800. In contrast, the semiconductor switches 220, 240, 260, and 280 switch their conduction states and non-conduction states, thereby make the capacitors 310 and 320 absorb the surge voltage, and connect in series the capacitors 310 and 320 having absorbed the surge voltage to the direct-current power supply 600.

In FIG. 2, one end of the semiconductor switches 210 to 240 is connected to the input terminal 120, and the other end of the semiconductor switches 250 to 280 is connected to the input terminal 130, respectively. The other end of the semiconductor switch 210 and one end of the semiconductor switch 250 are connected to the output terminal 140, and the other end of the semiconductor switch 230 and one end of the semiconductor switch 270 are connected to the output terminal 150. The other end of the semiconductor switch 220 and one end of the semiconductor switch 260 are connected to the output terminal 140 through the capacitor 310, and the other end of the semiconductor switch 240 and one end of the semiconductor switch 280 are connected to the output terminal 150 through the capacitor 320, respectively.

The control unit 110 outputs a switching signal indicating conduction states or non-conduction states to the eight semiconductor switches 210 to 280, by which the control unit 110 controls the conduction states and the non-conduction states of the semiconductor switches 210 to 280.

Next, the detailed operation of the switching output circuit 100 in accordance with the present exemplary embodiment will be described in detail according to FIG. 3.

Figure 3:
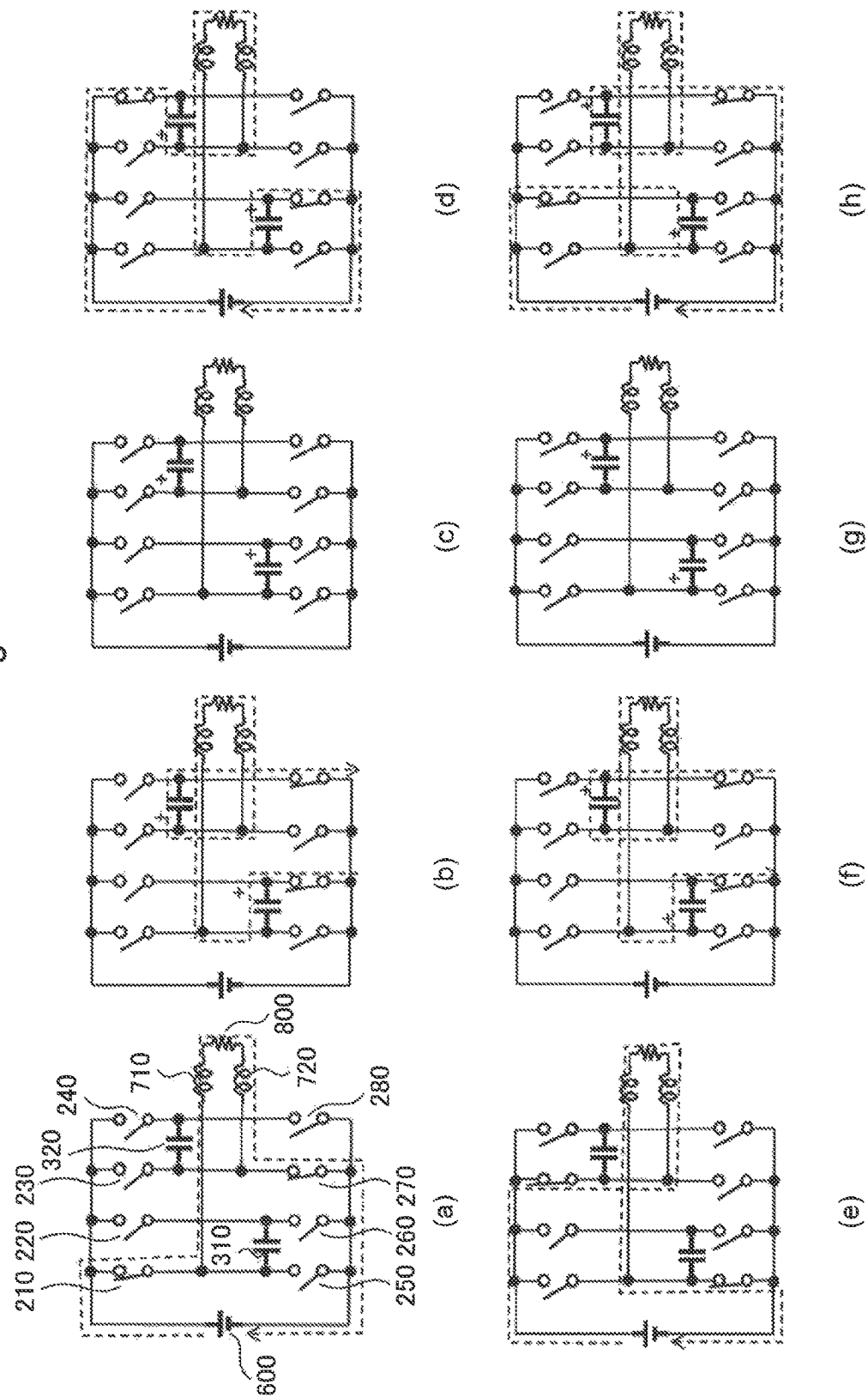
FIG. 3 is a diagram illustrating an operation procedure of the switching output circuit 100 in accordance with the second exemplary embodiment.

First, the control unit 110, as shown in (a) of FIG. 3, switches the semiconductor switches 210 and 270 to the conduction states and the other semiconductor switches to the non-conduction states. This makes a current flow through a pathway of direct-current power supply 600→semiconductor switch 210→parasitic inductance 710→load resistance 800→parasitic inductance 720→semiconductor switch 270→direct-current power supply 600. At this time, electromagnetic energy is accumulated in the parasitic inductances 710 and 720.

Next, the control unit 110, as shown in (b) of FIG. 3, switches the semiconductor switches 260 and 280 to the conduction states and the other semiconductor switches to the non-conduction states. This makes the electromagnetic energy accumulated in the parasitic inductances 710 and 720 released from them. A current flows through a pathway of semiconductor switch 260→capacitor 310→parasitic inductance 710→load resistance 800→parasitic inductance 720→capacitor 320→semiconductor switch 280, so that the capacitors 310 and 320 are charged with a voltage having positive polarity on the upstream side.

After the capacitors 310 and 320 have absorbed the surge voltage from the parasitic inductances 710 and 720, the control unit 110, as shown in (c) of FIG. 3, switches all the semiconductor switches to the non-conduction states. This makes the voltage charged in the capacitors 310 and 320 retained without change.

The control unit 110, as shown in (d) of FIG. 3, switches the semiconductor switches 240 and 260 to the conduction states and the other semiconductor switches to the non-conduction states. This makes the capacitor 310 and 320 having absorbed the surge voltage, the direct-current power supply 600, the parasitic inductances 710 and 720, and the load resistance 800 connected in series, and makes a voltage obtained by adding the voltages of the capacitors 310 and 320 to the voltage of the direct-current power supply 600 applied to the load resistance 800. A current flows through a pathway of direct-current power supply 600→semiconductor switch 240→capacitor 320→parasitic inductance 720→load resistance 800→parasitic inductance 710→capacitor 310→semiconductor switch 260→direct-current power supply 600, so that the voltage of the capacitors 310 and 320 becomes zero.

In addition, the control unit 110, as shown in (e) of FIG. 3, switches the semiconductor switches 230 and 250 to the conduction states and the other semiconductor switches to the non-conduction states. This makes a current flow through a pathway of direct-current power supply 600→semiconductor switch 230→parasitic inductance 720→load resistance 800→parasitic inductance 710→semiconductor switch 250→direct-current power supply 600. At this time, electromagnetic energy is accumulated in the parasitic inductances 710 and 720.

Next, the control unit 110, as shown in (f) of FIG. 3, switches the semiconductor switches 260 and 280 to the conduction states and the other semiconductor switches to the non-conduction states. This makes the electromagnetic energy accumulated in the parasitic inductances 710 and 720 released from them. A current flows through a pathway of semiconductor switch 280→capacitor 320→parasitic inductance 720→load resistance 800→parasitic inductance 710→capacitor 310→semiconductor switch 260, so that the capacitors 310 and 320 are charged with a voltage having positive polarity on the upstream side. Here, the positive polarity of the capacitors 310 and 320 in (b) of FIG. 3 lies on the side opposite to that in (f) of FIG. 3.

After the capacitors 310 and 320 have absorbed the surge voltage from the parasitic inductances 710 and 720, the control unit 110, as shown in (g) of FIG. 3, switches all the semiconductor switches to the non-conduction states. This makes the voltage charged in the capacitors 310 and 320 retained without change.

The control unit 110, as shown in (h) of FIG. 3, switches the semiconductor switches 220 and 280 to the conduction states, and the other semiconductor switches to the non-conduction states. This makes the capacitors 310 and 320 having absorbed the surge voltage, the direct-current power supply 600, the parasitic inductances 710, 720, and the load resistance 800 connected in series, and makes a voltage obtained by adding the voltages of the capacitors 310 and 320 to the voltage of the direct-current power supply 600 applied to the load resistance 800. A current flows through a pathway of direct-current power supply 600→semiconductor switch 220→capacitor 310→parasitic inductance 710→load resistance 800→parasitic inductance 720→capacitor 320→semiconductor switch 280→direct-current power supply 600, so that the voltage of the capacitors 310 and 320 becomes zero.

The switching output circuit 100 configured as described above includes the semiconductor switches 220, 240, 260, and 280 and switches their conduction states and non-conduction states appropriately, which enables the capacitors 310 and 320 to absorb efficiently the surge voltage of the electromagnetic energy accumulated in the parasitic inductances 710 and 720. In addition, the capacitors 310 and 320 having absorbed the surge voltage, the direct-current power supply 600, and the load resistance 800 are connected in series, which makes it possible to supply electric power to the load resistance 800 adding a value of the surge voltage to the voltage value of the direct-current power supply 600. This makes the leading edge of the output voltage of the switching output circuit 100 improve.

Figure 4:
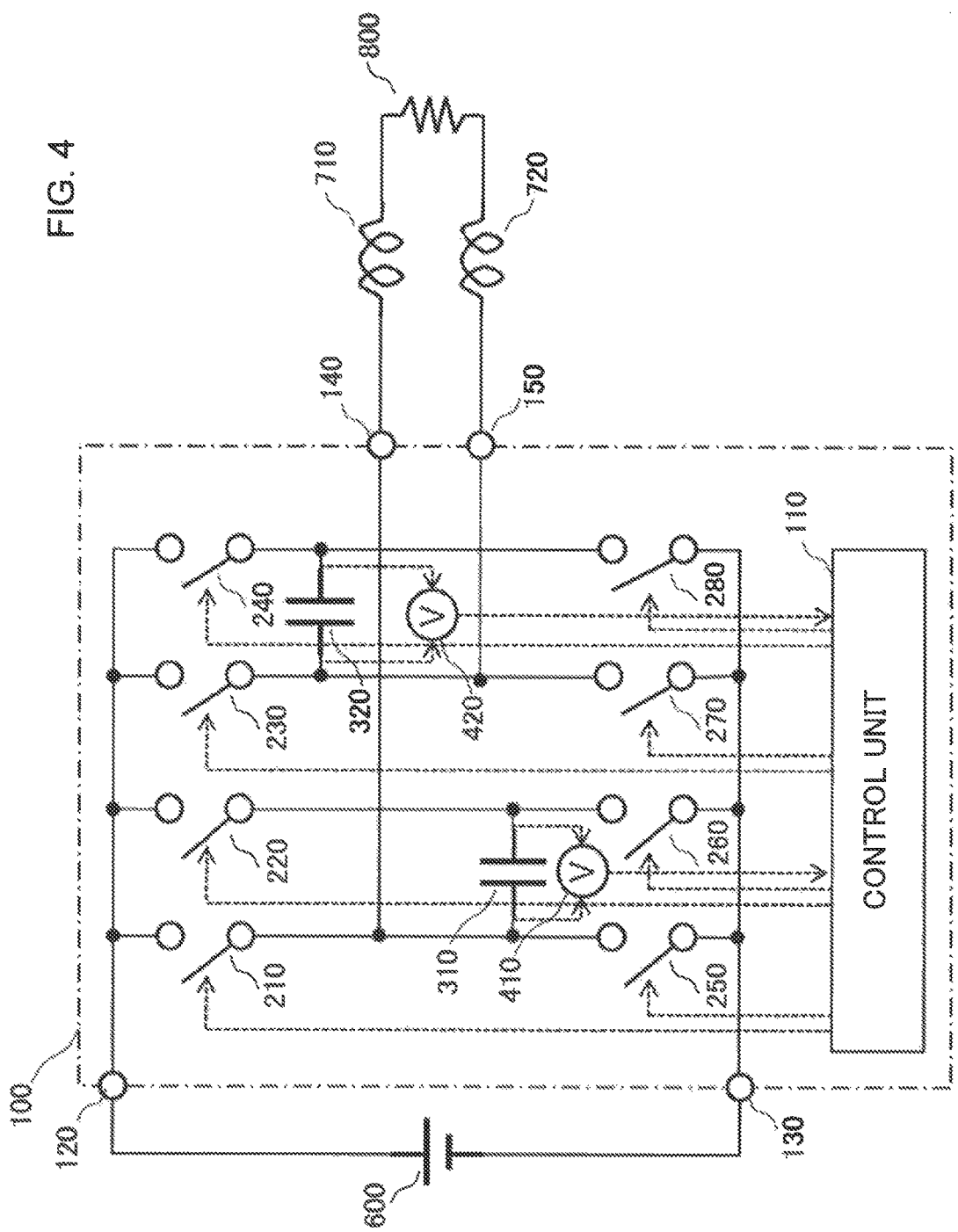
FIG. 4 is a circuit block diagram of the switching output circuit 100 in accordance with the second exemplary embodiment.

In the switching output circuit 100, it is preferable to monitor the voltages between the terminals of the capacitors 310 and 320, and to switch all the semiconductor switches 210 to 280 to the non-conduction states when the voltage values between the terminals of the capacitors 310 and 320 have reached a maximum. FIG. 4 illustrates a circuit block diagram in which voltage monitors to monitor the voltages between the terminals of the capacitors 310 and 320 are disposed in the switching output circuit 100.

In FIG. 4, the voltage monitor 410 is connected to both terminals of the capacitors 310, measures the voltage between both terminals of the capacitors 310, and sends it to the control unit 110. In contrast, the voltage monitor 420 is connected to both terminals of the capacitor 320, measures the voltage between both terminals of the capacitor 320, and sends it to the control unit 110.

In (b) and (f) of FIG. 3, the control unit 110 determines that the surge voltage due to the electromagnetic energy accumulated in the parasitic inductances 710 and 720 is absorbed entirely in the capacitors 310 and 320 when the measurements of the voltage monitors 410 and 420 have reached a maximum value. Then, as shown in (c) and (g) of FIG. 3, the control unit 110 switches all the semiconductor switches 210 to 280 to the non-conduction states.

The semiconductor switches 210 to 280 are made the non-conduction states when the voltages between both terminals of the capacitors 310 and 320 have reached a maximum value, which makes it possible to keep the capacitors 310 and 320 in a state where the electromagnetic energy accumulated in the parasitic inductances 710 and 720 is charged maximally.

With the capacitors 310 and 320 holding the surge voltage maximally, as shown in (d) and (h) of FIG. 3, the direct-current power supply 600, the capacitor 310 and 320, the parasitic inductances 710 and 720, and the load resistance 800 are connected in series. This makes it possible to apply effectively the surge voltage absorbed in the capacitors 310 and 320 in addition to the voltage from the direct-current power supply 600, to the parasitic inductances 710, 720 and the load resistance 800.

Consequently, the switching output circuit 100 in accordance with the present exemplary embodiment can regenerate efficiently the electromagnetic energy accumulated in the parasitic inductances 710 and 720 and improve the leading edge of the output voltage.

Figure 5:
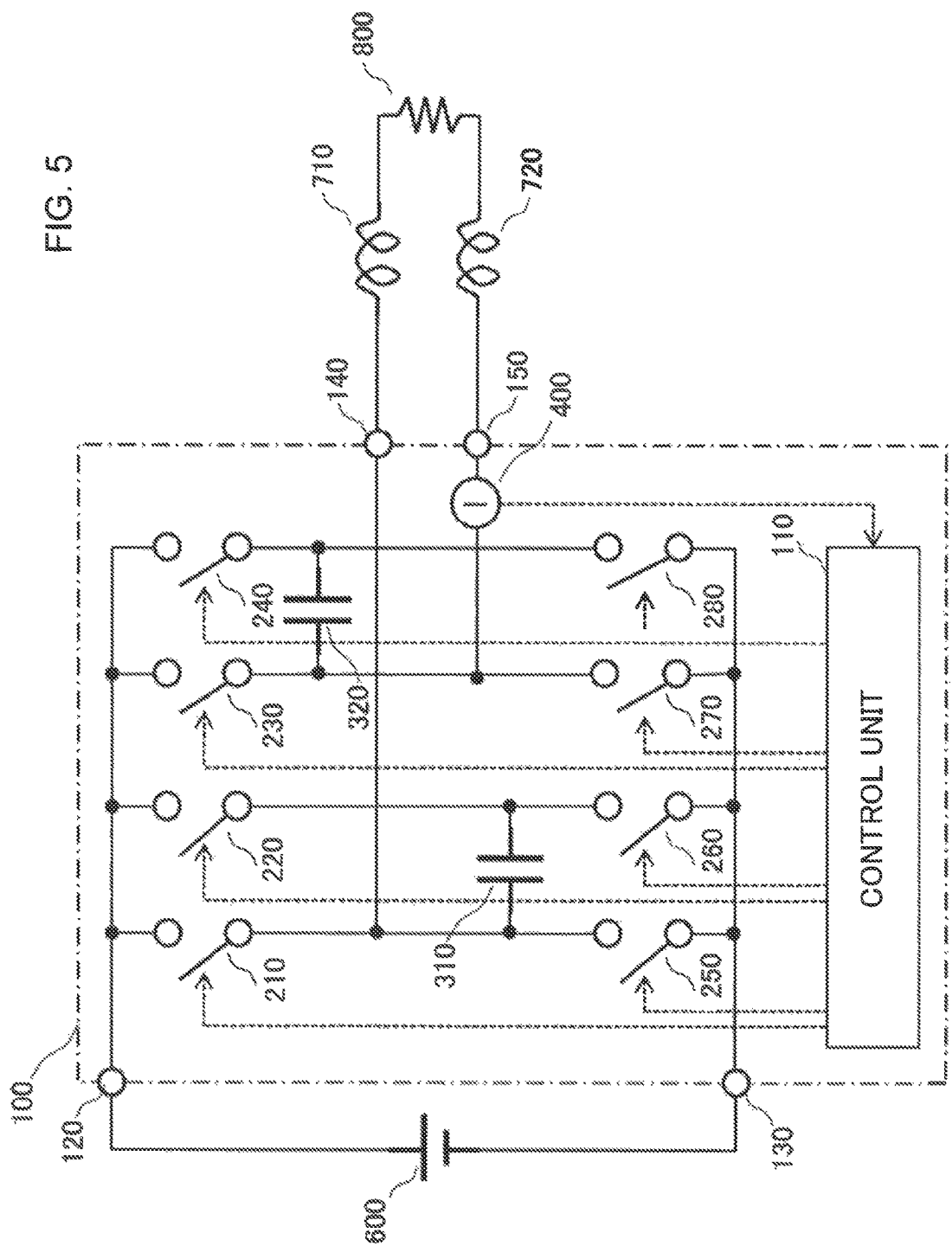
FIG. 5 is a circuit block diagram of another switching output circuit 100 in accordance with the second exemplary embodiment.

The present exemplary embodiment can be configured as described below instead of the configuration in which to monitor the voltage values between both terminals of the capacitors 310 and 320 by the voltage monitors 410 and 420 and switch all the semiconductor switches to the non-conduction states when the voltage values between both terminals of the capacitors 310 and 320 having reached a maximum. That is to say, it is also possible to measure a current flowing through the output terminal of the switching output circuit 100 and switch all the semiconductor switches 210 to 280 to the non-conduction states when the current flowing through the output terminal becoming zero. FIG. 5 illustrates a circuit block diagram of the switching output circuit 100 in this case.

In FIG. 5, a current monitor 400 is disposed near an output terminal 150 of the switching output circuit 100, and the current monitor 400 measures a current flowing through the output terminal 150. When a current flowing through the output terminal 150 has become zero in (b) and (f) of FIG. 3 due to the fact that all of the accumulated electromagnetic energy is released from the parasitic inductances 710 and 720, the control unit 110 switches all the semiconductor switches 210 to 280 to the non-conduction states ((c) and (g) of FIG. 3).

By making the semiconductor switches 210 to 280 the non-conduction states when the current flowing through the output terminal 150 has become zero, it is possible to keep the capacitors 310 and 320 in a state where the electromagnetic energy accumulated in the parasitic inductances 710 and 720 is charged maximally. Accordingly, when the direct-current power supply 600, the capacitors 310 and 320, the parasitic inductances 710 and 720, and the load resistance 800 are connected in series in (d) and (h) of FIG. 3, the surge voltage absorbed in the capacitors 310 and 320, in addition to the voltage from the direct-current power supply 600, is effectively applied to the load resistance 800. Therefore, the switching output circuit 100 illustrated in FIG. 5 can also regenerate efficiently the electromagnetic energy accumulated in the parasitic inductances 710 and 720 and improve the leading edge of the output voltage.

<A Third Exemplary Embodiment>

Figure 6:
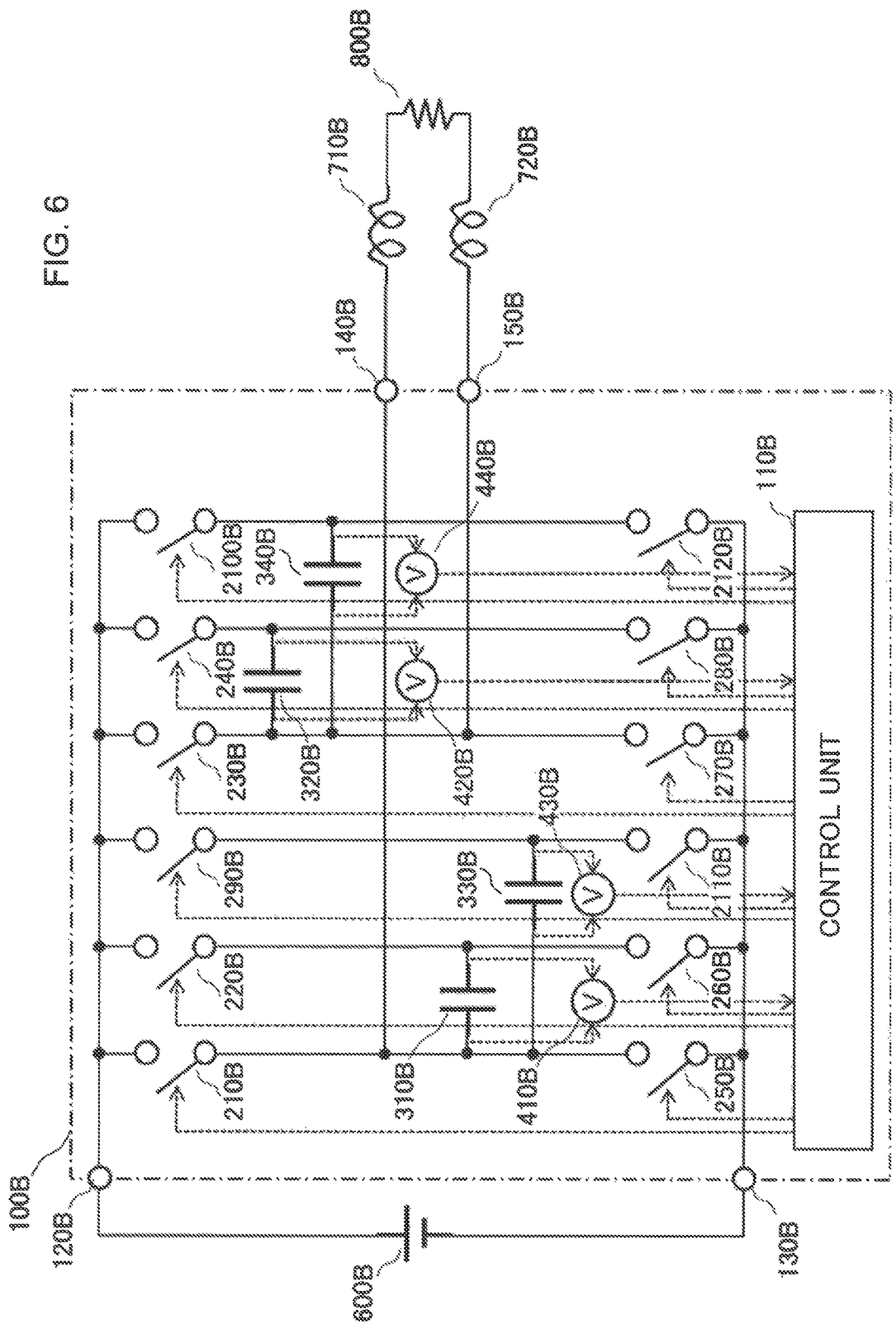
FIG. 6 is a circuit block diagram of a switching output circuit 100B in accordance with a third exemplary embodiment.

A third exemplary embodiment will be described. FIG. 6 illustrates a circuit block diagram of a switching output circuit in accordance with the present exemplary embodiment. A switching output circuit 100B switches power supplied through a direct-current power supply 600B and supplies the power to two parasitic inductances 710B, 720B and a load resistance 800. The direct-current power supply 600B, the parasitic inductances 710B and 720B, and the load resistance 800B function as with the direct-current power supply 600, the parasitic inductances 710 and 720, and the load resistance 800 that are described in the second exemplary embodiment. Here, the combined inductance of the parasitic inductance 710B and parasitic inductance 720B is represented by L.

The switching output circuit 100B is configured by twelve semiconductor switches 210B to 2120B, four capacitors 310B to 340B, and four voltage monitors 410B to 440B, and further includes a control unit 110B, input terminals 120B and 130B, and output terminals 140B and 150B. The capacitance of the capacitors 310B and 320B is represented by C1, and that of the capacitors 330B and 340B is represented by C2. The capacitance C2 of the capacitors 330B and 340B is smaller than the capacitance C1 of the capacitors 310B and 320B.

One end of the semiconductor switches 210B to 240B, 290B, and 2100B is connected to the input terminal 120B, and the other end of the semiconductor switches 250B to 280B, 2110B, and 2120B is connected to the input terminal 130B, respectively. The other end of the semiconductor switch 210B and one end of the semiconductor switch 250B are connected to the output terminal 140B, and the other end of the semiconductor switch 230B and one end of the semiconductor switch 270B are connected to the output terminal 150B, respectively.

The other end of the semiconductor switch 220B and one end of the semiconductor switch 260B are connected to the output terminal 140B through the capacitor 310B, and the other end of the semiconductor switch 290B and one end of the semiconductor switch 2110B are connected to the output terminal 140B through the capacitor 330B, respectively. The other end of the semiconductor switch 240B and one end of the semiconductor switch 280B are connected to the output terminal 150B through the capacitor 320B, and the other end of the semiconductor switch 2100B and one end of the semiconductor switch 2120B are connected to the output terminal 150B through the capacitor 340B, respectively.

The voltage monitors 410B to 440B are connected to both terminals of the capacitors 310B to 340B respectively, measure the voltages between both terminals of the capacitors 310B to 340B respectively, and send them to the control unit 110B.

Next, the detailed operation of the switching output circuit 100B in accordance with the present exemplary embodiment will be described using FIG. 7 to FIG. 9. First, as shown in (a) of FIG. 7 to FIG. 9, the control unit 110B switches the semiconductor switches 210B and 270 to the conduction states, and the other semiconductor switches to the non-conduction states. This makes a current flows through a pathway of direct-current power supply 600B→semiconductor switch 210B→parasitic inductance 710B→load resistance 800B→parasitic inductance 720B→semiconductor switch 270B→direct-current power supply 600B.

Figure 7:
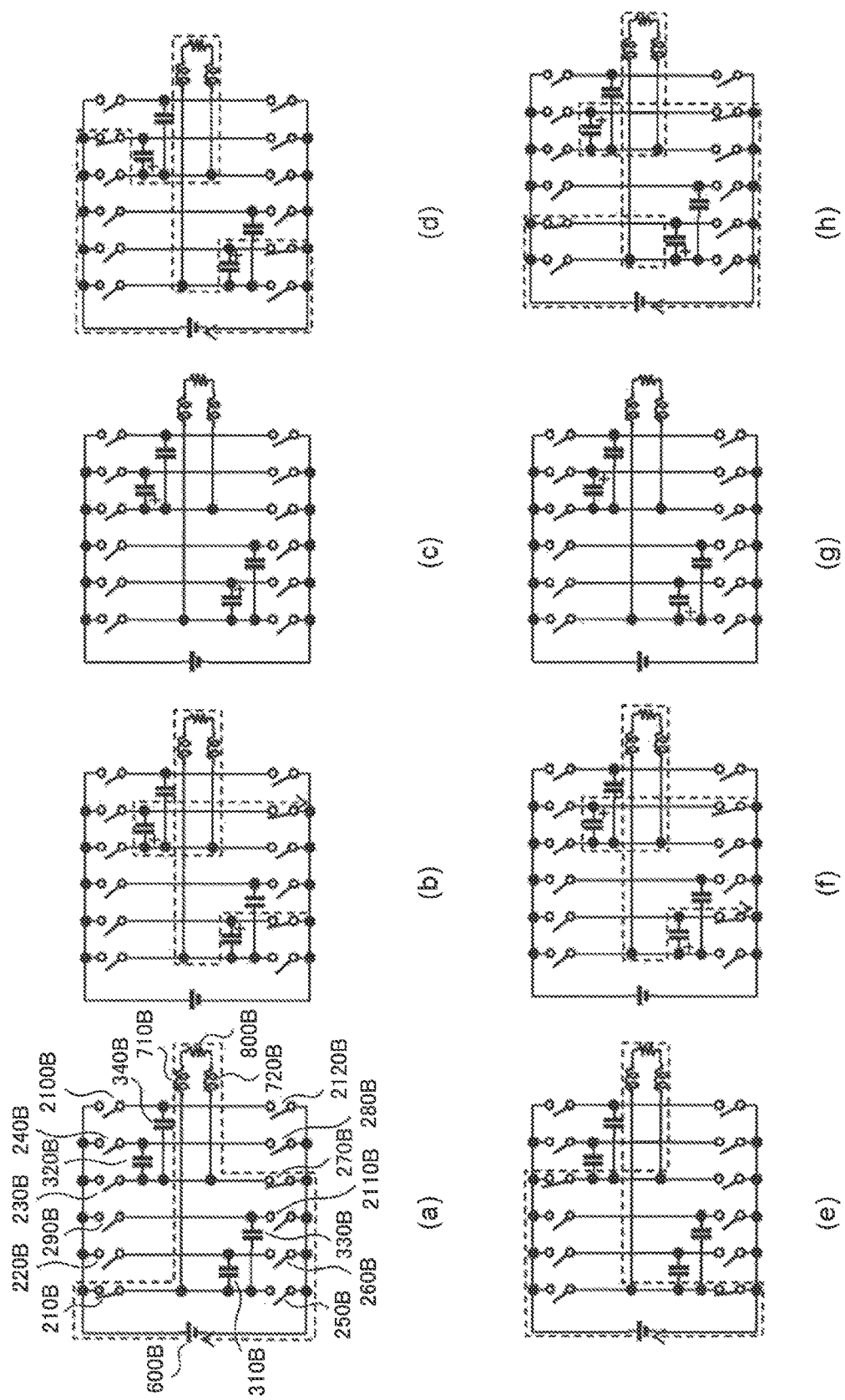
FIG. 7 is a diagram illustrating an operation procedure of the switching output circuit 100B in accordance with the third exemplary embodiment.

Next, when the control unit 110B switches the semiconductor switches 260B, 280B to the conduction states and the other semiconductor switches to the non-conduction states as shown in (b) of FIG. 7, a current flows through a pathway of semiconductor switch 260B→capacitor 310B→parasitic inductance 710B→load resistance 800B→parasitic inductance 720B→capacitor 320→semiconductor switch 280B. The capacitors 310B and 320B are charged with a voltage having a positive polarity on the upstream side. In this case, a time T1 from when the voltage values between both terminals of the capacitors 310B and 320B are zeros till when they reach maximum values is equal to $\lambda/2 \cdot (L \cdot C1)^{1/2}$.

Figure 8:
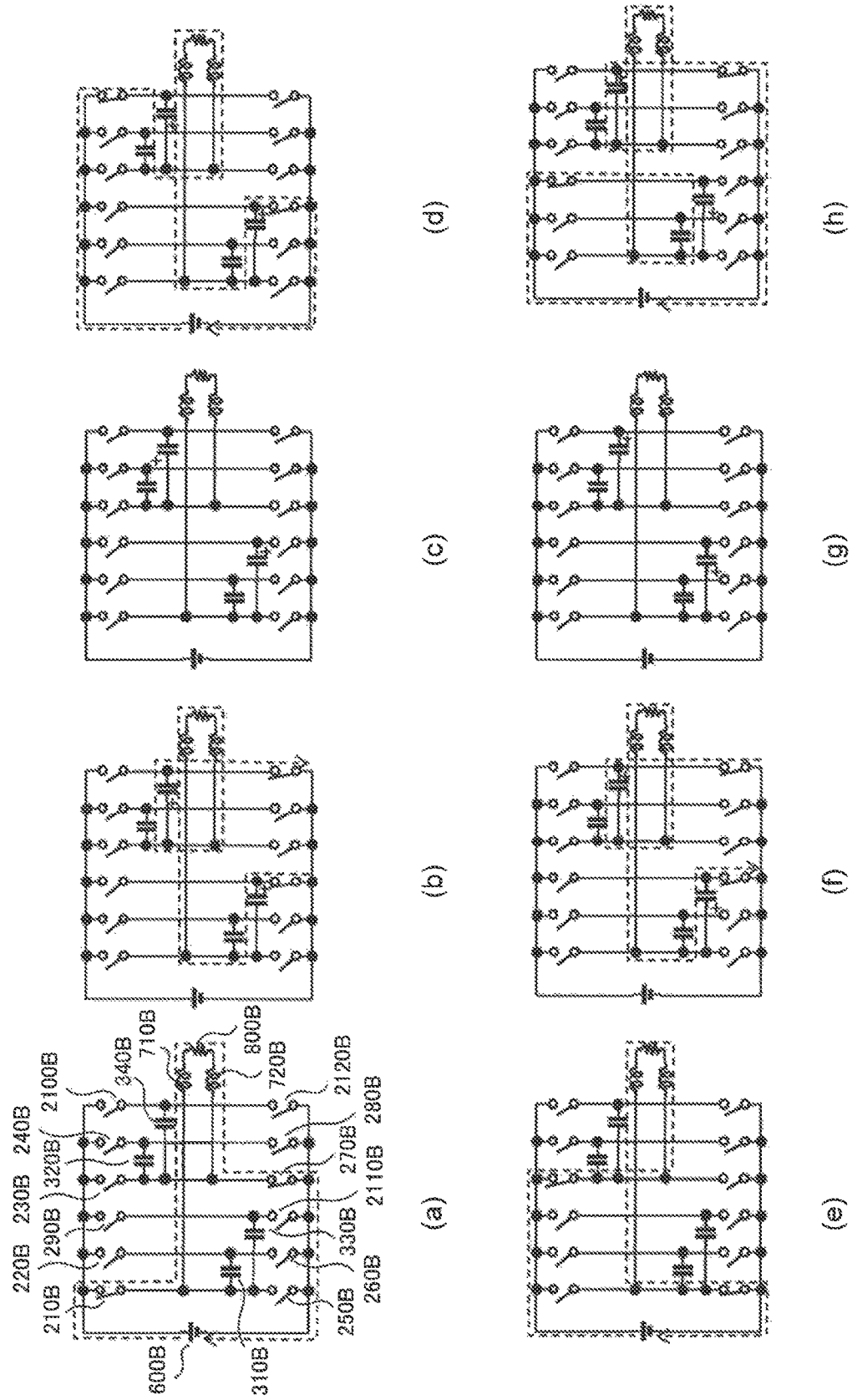
FIG. 8 is a diagram illustrating an operation procedure of the switching output circuit 100B in accordance with the third exemplary embodiment.

In contrast, when the control unit 110B switches the semiconductor switches 2110B and 2120B to the conduction states and the other semiconductor switches to the non-conduction states as shown in (b) of FIG. 8, a current flows through a pathway of semiconductor switch 2110B→capacitor 330B→parasitic inductance 710B→load resistance 800B→parasitic inductance 720B→capacitor 340B→semiconductor switch 2120B. The capacitors 330B and 340B are charged with a voltage having a positive on the upstream side. In this case, a time T2 from when the voltage values between both terminals of the capacitors 330B and 340B are zeros till when they reach maximum values is equal to $\pi/2 \cdot (L \cdot C2)^{1/2}$.

Because the capacitance C2 of the capacitors 330B and 340B is smaller than the capacitance C1 of the capacitors 310B and 320B, the time T2 from when the voltage values between both terminals of the capacitors 330B and 340B are zeros till when they reach maximum values is shorter than the time T1 from when the voltage values between both terminals of the capacitors 310B and 320B are zeros till when they reach maximum values.

Figure 9:
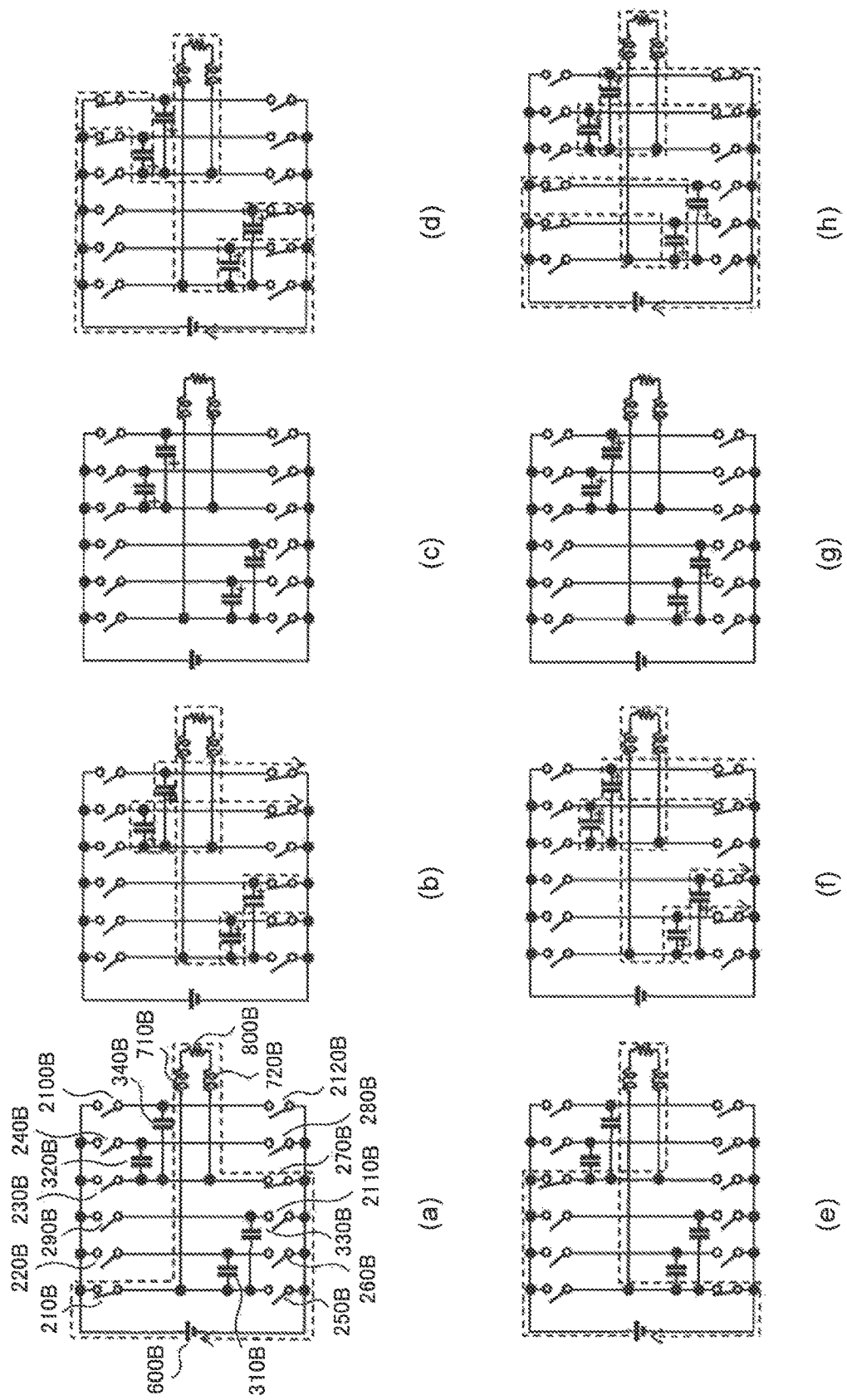
FIG. 9 is a diagram illustrating an operation procedure of the switching output circuit 100B in accordance with the third exemplary embodiment.

When the control unit 110B switches the semiconductor switches 260B, 280B, 2110B, and 2120B to the conduction states and the other semiconductor switches to the non-conduction states as shown in (b) of FIG. 9, a current flows through a pathway of semiconductor switch 260B→capacitor 310B→parasitic inductance 710B→load resistance 800B→parasitic inductance 720B→capacitor 320B→semiconductor switch 280B, and through a pathway of semiconductor switch 2110B→capacitor 330B→parasitic inductance 710B→load resistance 800B→parasitic inductance 720B→capacitor 340B→semiconductor switch 2120B. The capacitors 310B to 340B are charged with a voltage having a positive polarity on the upstream side. In this case, a time T3, from when the voltage values between both terminals of the combined capacitance of the capacitor 310B and the capacitor 330B and of the combined capacitance of the capacitor 320B and capacitor 340B are zeros till when they reach maximum values, is equal to $\pi/2 \cdot \{L \cdot (C1+C2)\}^{1/2}$.

Because the combined capacitance (C1+C2) is larger than the capacitance C1 of the capacitors 310B and 320B, the time T3 from when the voltage values between both terminals of the capacitors 310B and the capacitor 330B, and of the capacitor 320B and capacitor 340B are zeros till when they reach maximum values is longer than the time T1 from when the voltage values between both terminals of the capacitors 310B and 320B are zeros till when they reach maximum values. Consequently, the times from when the voltage value between both terminals of the capacitor is zero till when it reaches a maximum value satisfy the relation of T2<T1<T3.

If the states illustrated in (b) of FIG. 7 to FIG. 9 are set for a desired period, an optimum setting is selected from among those of (b) in FIG. 7 to FIG. 9 based on the combined inductance L of the parasitic inductance 710B and the parasitic inductance 720B. For example, when the combined inductance L of the parasitic inductance 710B and the parasitic inductance 720B is large, the setting illustrated in (b) of FIG. 8 is selected in which the time from when the voltage value between both terminals of the capacitor is zero till when it reaches a maximum value is equal to T2 that is shortest. In contrast, when the combined inductance L is small, the setting illustrated in (b) of FIG. 9 is selected in which the time from when the voltage value between both terminals of the capacitor is zero till when it reaches a maximum value is equal to T3 that is longest. This makes it possible to charge efficiently the capacitors 310B to 340B with the electromagnetic energy released from the parasitic inductances 710B and 720B.

However, the combined inductance L of the parasitic inductance 710B and the parasitic inductance 720B cannot be measured by the configuration illustrated in FIG. 6. For this reason, the voltage values between both terminals of the capacitors 310B to 340B are measured by the voltage monitors 410B to 440B, and the setting is selected from among the configurations of (b) in FIG. 7 to FIG. 9 in which |Vc−Vc'|/Vc is at a minimum, where Vc represents a voltage between both terminals of the capacitor after a period Tr during which the state is one of (b) in FIG. 7 to FIG. 9, and Vc' represents a voltage between both terminals of the capacitor one sampling time before Tr.

If the setting in (b) of FIG. 7 is selected, the control unit 110B switches the semiconductor switches 210B to 2120B between the conduction states and the non-conduction states in order of (c) to (h) in FIG. 7. If the setting in (b) of FIG. 8 is selected, the control unit 110B switches the semiconductor switches 210B to 2120B between the conduction states and the non-conduction states in order of (c) to (h) in FIG. 8. If the setting in (b) of FIG. 9 is selected, the control unit 110B switches the semiconductor switches 210B to 2120B between the conduction states and the non-conduction states in order of (c) to (h) in FIG. 9.

Also in the switching output circuit 100B in accordance with the present exemplary embodiment, the control unit 110B switches sequentially the semiconductor switches 210B to 2120B between the conduction states and the non-conduction states, which makes it possible to apply, to the load resistance 800B, the surge voltage charged in any of the capacitors 310B, 320B, the capacitors 330B, 340B, and the capacitors 310B to 340B in addition to the voltage of the direct-current power supply 600B. Consequently, it is possible to improve the leading edge of the output voltage and control the output power accurately by regenerating efficiently the electromagnetic energy accumulated in the parasitic inductance 710B and 720B.

Additionally, in the switching output circuit 100B in accordance with the present exemplary embodiment, any setting of the configurations of (b) in FIG. 7 to FIG. 9 is employed so that |Vc−Vc'|/Vc may be at a minimum, where Vc represents a voltage between both terminals of the capacitor after the period Tr, and Vc' represents a voltage between both terminals of the capacitor one sampling time before Tr, which makes it possible to regenerate the electromagnetic energy accumulated in the parasitic inductance 710B and 720B efficiently in the capacitors 310B to 340B during a desired period.

<A Modification Example of the Third Exemplary Embodiment>

Figure 10:
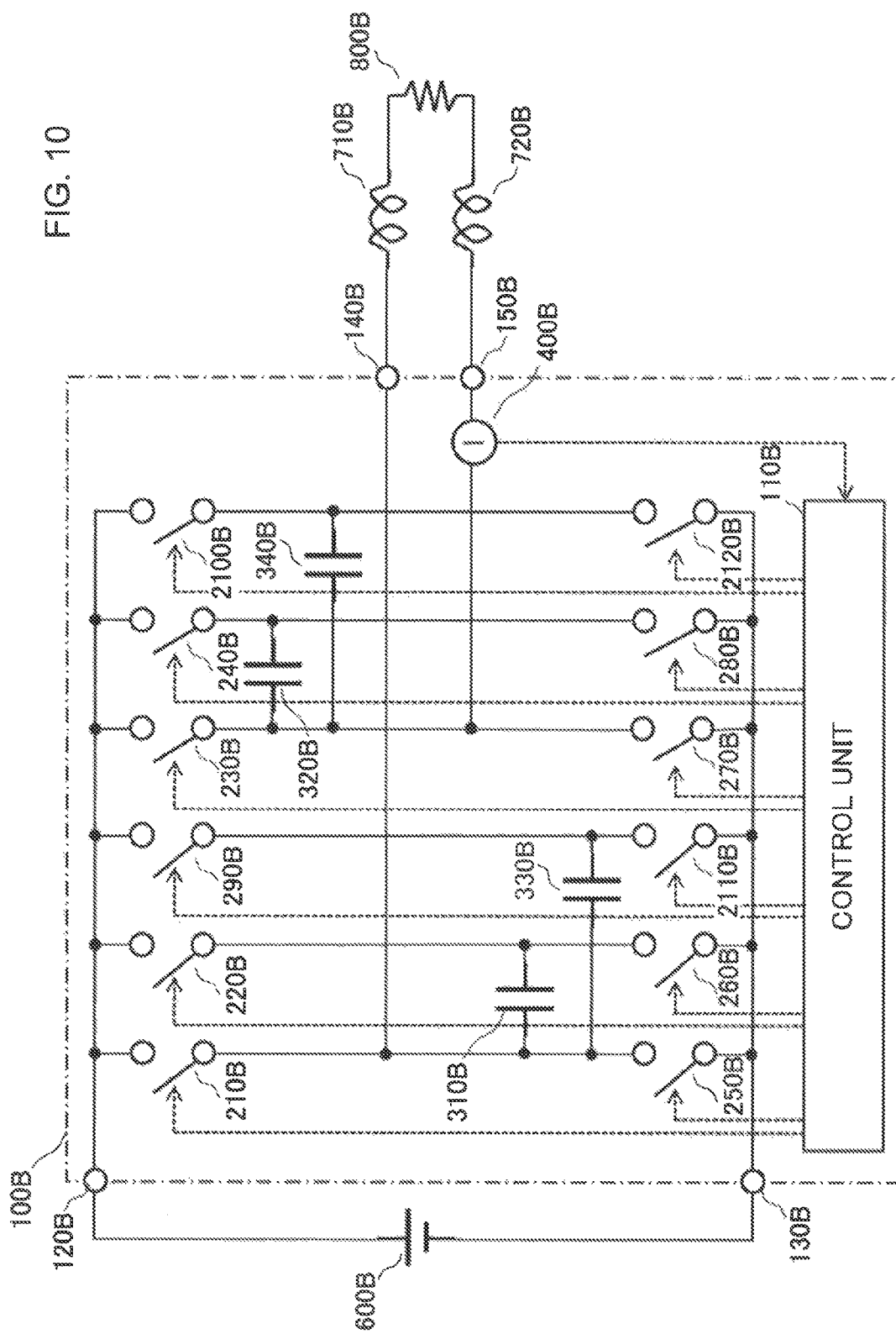
FIG. 10 is a circuit block diagram of the switching output circuit 100B in accordance with a variation of the third exemplary embodiment.

A modification example of the third exemplary embodiment will be explained. In the present exemplary embodiment, a current flowing through an output terminal is measured instead of measuring the voltage between both terminals of the capacitor. All the semiconductor switches 210B to 2120B are switched to the non-conduction states when the current flowing through the output terminal has becomes zero instead of being switched when the measurements of the voltage between both terminals have reached a maximum value. FIG. 10 illustrates a circuit block diagram of the switching output circuit in accordance with the present exemplary embodiment.

As shown in FIG. 10, a current monitor 400B is disposed near the output terminal 150B. The combined inductance of the parasitic inductance 710B and the parasitic inductance 720B is represented by L, the capacitance of the capacitors 310B and 320B is represented by C1, and the capacitance of the capacitors 330B and 340B is represented by C2. The capacitance C2 of the capacitors 330B and 340B is smaller than the capacitance C1 of the capacitors 310B and 320B.

In a switching output circuit 100B configured as described above, first, the control unit 110B switches the semiconductor switches 210B and 270B to the conduction states and the other semiconductor switches to the non-conduction states, as shown in (a) of FIG. 7 to FIG. 9.

Next, the control unit 110B controls the semiconductor switches 210B to 2120B between the conduction states and the non-conduction states as shown in (b) of FIG. 7 to FIG. 9, which makes the capacitors 310B, 320B in (b) of FIG. 7, the capacitors 330B and 340B in (b) of FIG. 8, and the capacitors 310B to 340B in (b) of FIG. 9, charged with a voltage having a positive polarity on the upstream side.

As described in the third exemplary embodiment, the time T1, from when the voltage values between both terminals of the capacitors 310B and 320B are zeros till when they reach maximum values, in (b) of FIG. 7 is expressed by $\pi/2 \cdot (L \cdot C1)^{1/2}$. The time T2, from when the voltage values between both terminals of the capacitors 330B and 340B are zeros till when they reach maximum values, in (b) of FIG. 8 is expressed by $\pi/2 \cdot (L \cdot C2)^{1/2}$. The time T3, from when the voltage values between both terminals of the combined capacitance of the capacitor 310B and the capacitor 330B and of the combined capacitance of the capacitor 320B and capacitor 340B are zeros till when they reach maximum values, in (c) of FIG. 9 is expressed by $\pi/2 \cdot \{L \cdot (C1+C2)\}^{1/2}$. Since the relation of C2<C1<(C1+C2) is satisfied, the times from when the voltage value between both terminals of the capacitor is zero till when it reaches a maximum value satisfy the relation of T2<T1<T3.

As described in the third exemplary embodiment, when the combined inductance L of the parasitic inductance 710B and the parasitic inductance 720B is large, the setting illustrated in (b) of FIG. 8 is selected in which the time from when the voltage value between both terminals of the capacitor is zero till when it reaches a maximum value is equal to T2 that is shortest. In contrast, when the combined inductance L of the parasitic inductance 710B and the parasitic inductance 720B is small, the setting illustrated in (b) of FIG. 9 is selected in which the time from when the voltage value between both terminals of the capacitor is zero till when it reaches a maximum value is equal to T3 that is longest.

However, since the combined inductance L of the parasitic inductance 710B and the parasitic inductance 720B cannot be measured, the current flowing through the output terminal 150B is measured by the current monitor 400B in FIG. 10. Then, the setting is employed in which (Ic−Ic') becomes a negative value and is at a minimum, where Ic represents a current value flowing through the output terminal 150B after a period Tr during which the state is one of (b) in FIG. 7 to FIG. 9, and Ic' represents a current value flowing through the output terminal 150B one sampling time before Tr.

If the setting in (b) of FIG. 7 is selected, the control unit 110B switches the semiconductor switches 210B to 2120B between the conduction states and the non-conduction states in order of (c) to (h) in FIG. 7. If the setting in (b) of FIG.

8 is selected, the control unit 110B switches the semiconductor switches 210B to 2120B between the conduction states and the non-conduction states in order of (c) to (h) in FIG. 8. If the setting in (b) of FIG. 9 is selected, the control unit 110B switches the semiconductor switches 210B to 2120B between the conduction states and the non-conduction states in order of (c) to (h) in FIG. 9.

In the switching output circuit 100B in accordance with the present exemplary embodiment, any setting of the configurations of (b) in FIG. 7 to FIG. 9 is selected so that (Ic−Ic') may become a negative value and |Ic| may be at a minimum, where Ic represents a current value flowing through the output terminal 150B after the period Tr, and Ic' represents a current value flowing through the output terminal 150B one sampling time before Tr. This makes it possible to regenerate the electromagnetic energy accumulated in the parasitic inductance 710B and 720B efficiently in the capacitors 310B to 340B during a desired period.

<A Fourth Exemplary Embodiment>

A fourth exemplary embodiment will be described. A switching output circuit in accordance with the present exemplary embodiment is configured as is the case with the switching output circuit in FIG. 6 described in the third exemplary embodiment. In the following description, the sign "B" of each element of the switching output circuit in FIG. 6 is replaced by "C".

The combined inductance of a parasitic inductance 710C and a parasitic inductance 720C is represented by L, the capacitance of capacitors 310C and 320C by C1, the capacitance of capacitors 330C and 340C by C2, the voltage of a direct-current power supply 600C by $V_0$, and the resistance value of a load resistance 800C by R. The capacitance C2 of the capacitors 330C and 340C is smaller than the capacitance C1 of the capacitors 310C and 320C.

The detailed operation of a switching output circuit 100C in accordance with the present exemplary embodiment will be described using FIG. 7 to FIG. 9 by which the third exemplary embodiment is described. As is the case with the third exemplary embodiment, first, the control unit 110C switches the semiconductor switches 210C and 270C to the conduction states and the other semiconductor switches to the non-conduction states as shown in (a) of FIG. 7 to FIG. 9. This makes a current flow through a pathway of direct-current power supply 600C→semiconductor switch 210C→parasitic inductance 710C→load resistance 800C→parasitic inductance 720C→semiconductor switch 270C→direct-current power supply 600C. As a result, the electromagnetic energy is accumulated in the parasitic inductances 710C and 720C.

Next, when the control unit 110C switches the semiconductor switches 260C and 280C to the conduction states state and the other semiconductor switches to the non-conduction states as shown in (b) of FIG. 7, a current flows through a pathway of semiconductor switch 260C→capacitor 310C→parasitic inductance 710C→load resistance 800C→parasitic inductance 720C→capacitor 320C→semiconductor switch 280C. The capacitors 310C and 320C are charged with a voltage having a positive polarity on the upstream side. In this case, a maximum value Vc1 of the voltage values between both terminals of the capacitors 310C and 320C is equal to $(V_0 \cdot L^{1/2})/(R \cdot C1^{1/2})$.

In contrast, when the control unit 110C switches the semiconductor switches 2110C and 2120C to the conduction states and the other semiconductor switches to the non-conduction states as shown in (b) of FIG. 8, a current flows through a pathway of semiconductor switch 2110C→capacitor 330C→parasitic inductance 710C→load resistance 800C→parasitic inductance 720C→capacitor 340C→semiconductor switch 2120C. The capacitors 330C and 340C are charged with a voltage having a positive polarity on the upstream side. In this case, a maximum value Vc2 of the voltage values between both terminals of the capacitors 330C and 340C is equal to $(V_0 \cdot L^{1/2})/(R \cdot C2^{1/2})$.

Because the capacitance C2 of the capacitors 330C and 340C is smaller than the capacitance C1 of the capacitors 310C and 320C, the maximum value Vc2 of the voltage values between both terminals of the capacitors 330C and 340C is larger than the maximum value Vc1 of the voltage values between both terminals of the capacitors 310C and 320C.

As shown in (b) of FIG. 9, the control unit 110C switches the semiconductor switches 260C, 280C, 2110C, and 2120C to the conduction states and the other semiconductor switches to the non-conduction states. This makes a current flow through a pathway of the semiconductor switch 260C→capacitor 310C→parasitic inductance 710C→load resistance 800C→parasitic inductance 720C→capacitor 320C→semiconductor switch 280C, and through a pathway of semiconductor switch 2110C→capacitor 330C→parasitic inductance 710C→load resistance 800C→parasitic inductance 720C→capacitor 340C→semiconductor switch 2120C. The capacitors 310C to 340C are charged with a voltage having a positive polarity on the upstream side. In this case, a maximum value Vc3 of the voltage values between both terminals of the capacitors 310C, 330C, and capacitors 320C, 340C is equal to $(V_0 \cdot L^{1/2})/\{R \cdot (C1+C2)^{1/2}\}$.

Because the combined capacitance (C1+C2) of the capacitors 310C, 330C and capacitors 320C, 340C is larger than the capacitance C1 of the capacitors 310C and 330C, the maximum value Vc3 of the voltage values between both terminals of the capacitors 310C, 330C and the capacitors 320C, 340C is smaller than the maximum value Vc1 of the voltage values between both terminals of the capacitors 310C and 320C. Consequently, the maximum values of the voltage values between both terminals of the capacitors satisfy the relation of Vc3<Vc1<Vc2.

In order to set the maximum value of the voltage value between both terminals of the capacitor in a predetermined range, therefore, it is only necessary to select any setting of the configurations of (b) in FIG. 7 to FIG. 9 based on the combined inductance L of the parasitic inductance 710C and the parasitic inductance 720C. For example, when the combined inductance L of the parasitic inductance 710C and the parasitic inductance 720C is large, the setting illustrated in (b) of FIG. 9 is selected in which the maximum value of the voltage value between both terminals of the capacitor is smallest. In contrast, when the combined inductance L of the parasitic inductance 710C and the parasitic inductance 720C is small, the setting illustrated in (b) of FIG. 8 is selected in which the maximum value of the voltage value between both terminals of the capacitor is largest.

However, the combined inductance L of the parasitic inductance 710C and the parasitic inductance 720C cannot be measured by the configuration illustrated in FIG. 7. For this reason, the voltage values between both terminals of the capacitors 310C to 340C are measured by voltage monitors 410C to 440C. The setting is selected in which the relation of Va<$Vc_{max}$<Vb is satisfied, where Va represents a minimum value of the voltage value between both terminals of the capacitor to be set, Vb represents a maximum value of it, and $Vc_{max}$ represents a maximum value of the voltage value between both terminals of the capacitor in the settings of (b) in FIG. 7 to FIG. 9.

If the relation of Va<$Vc_{max}$<Vb is satisfied in all of the configurations, the setting is selected in which a time to $Vc_{max}$ is shortest. In contrast, if the relation of $Vc_{max}$<Va is satisfied in all of the settings, the setting illustrated in (b) of FIG. 8 is selected in which a maximum value of the voltage value between both terminals of the capacitor becomes largest. If the relation of Vb<$Vc_{max}$ is satisfied in all of the settings, the setting illustrated in (b) of FIG. 9 is selected in which a maximum value of the voltage value between both terminals of the capacitor becomes smallest.

If the setting illustrated in (b) of FIG. 7 is selected, the control unit 110C switches the semiconductor switches 210C to 2120C between the conduction states and the non-conduction states in order of (c) to (h) in FIG. 7. If the setting illustrated in (b) of FIG. 8 is selected, the control unit 110C switches the semiconductor switches 210C to 2120C between the conduction states and the non-conduction states in order of (c) to (h) in FIG. 8. If the setting illustrated in (b) of FIG. 9 is selected, the control unit 110C switches the semiconductor switches 210C to 2120C between the conduction states and the non-conduction states in order of (c) to (h) in FIG. 9.

Also in the switching output circuit 100C in accordance with the present exemplary embodiment, the control unit 110C switches sequentially the semiconductor switches 210C to 2120C between the conduction states and the non-conduction states, which makes it possible to apply, to the load resistance 800C, the surge voltage charged in any of the capacitors 310C, 320C, the capacitors 330C, 340C, and the capacitors 310C to 340C in addition to the voltage of the direct-current power supply 600C. Consequently, it is possible to improve the leading edge of the output voltage and control the output power accurately.

Additionally, in the switching output circuit 100C in accordance with the present exemplary embodiment, any setting of the configurations of (b) in FIG. 7 to FIG. 9 is selected so that the relation of Va<$Vc_{max}$<Vb may be satisfied, where Va represents a minimum value, in a predetermined range, of the voltage value between both terminals of the capacitor to be set, Vb represents a maximum value, and $Vc_{max}$ represents a maximum value of the voltage value between both terminals of the capacitor, which makes it possible to regenerate the electromagnetic energy accumulated in the parasitic inductances 710C and 720C efficiently in the capacitors 310C to 340C in the shortest period of time, preventing an excessive voltage from being applied between the terminals of a semiconductor switch.

<A Modification Example of the Fourth Exemplary Embodiment>

A modification example of the fourth exemplary embodiment will be explained. A switching output circuit in accordance with the present exemplary embodiment is configured as is the case with the switching output circuit in FIG. 10 described in the modification example of the third exemplary embodiment. In the following description, the sign "B" of each element of the switching output circuit in FIG. 10 is replaced by "C". That is to say, a current monitor 400C to measure a current flowing through an output terminal 150C is disposed near the output terminal 150C in FIG. 10.

In the above switching output circuit 100C, first, the control unit 110C switches the semiconductor switches 210C and 270C to the conduction states and the other semiconductor switches to the non-conduction states, as shown in (a) of FIG. 7 to FIG. 9, Next, the control unit 110C controls the semiconductor switches 210C to 2120C between the conduction states and the non-conduction states as shown in (b) of FIG. 7 to FIG. 9. This makes the capacitors 310C and 320C in (b) of FIG. 7, the capacitors 330C and 340C in (b) of FIG. 8, and the capacitors 310C to 340C in (b) of FIG. 9, charged with a voltage having a positive polarity on the upstream side.

At this time, in (b) of FIG. 7, a maximum value Vc1 of the voltage values between both terminals of the capacitors 310C and 320C is expressed by $\int Ic\, dt/C1$ using $\int Ic\, dt$ that represents the integral value of the current Ic to a time when the current Ic flowing through the output terminal 150C becomes zero. In (b) of FIG. 8, a maximum value Vc2 of the voltage values between both terminals of the capacitor 330C and 340C is expressed by $\int Ic\, dt/C2$. In addition, in (c) of FIG. 9, a maximum value Vc3 of the voltage values between both terminals of the capacitor 310C and the capacitor 330C, and of the capacitor 320C and the capacitor 340C is expressed by $\int Ic\, dt/(C1+C2)$. Since the relation of C2<C1<(C1+C2) is satisfied, the maximum values of the voltage values between both terminals of the capacitors satisfy the relation of Vc3<Vc1<Vc2.

Consequently, as described in the fourth exemplary embodiment, when the maximum value of the voltage value between both terminals of the capacitor is set within a predetermined range, any setting of the configurations of (b) in FIG. 7 to FIG. 9 is employed based on the combined inductance L of the parasitic inductance 710C and the parasitic inductance 720C, which makes it possible to regenerate the electromagnetic energy accumulated in the inductances 710C and 720C efficiently in the capacitors 310C to 340C. Specifically, when the combined inductance L of the parasitic inductance 710C and the parasitic inductance 720C is large, the setting illustrated in (b) of FIG. 9 is employed in which the maximum value of the voltage value between both terminals of the capacitor becomes smaller. When the combined inductance L is small, the setting illustrated in (b) in FIG. 8 is selected in which the maximum value of the voltage value between both terminals of the capacitor becomes larger.

However, since the combined inductance L of the parasitic inductance 710C and the parasitic inductance 720C cannot be measured, the current flowing through the output terminal 150C is measured by the current monitor 400C. Then, the setting by which the relation of Va<$Vc_{max}$<Vb is satisfied is selected, where Va represents a minimum value of the voltage values between both terminals of a capacitor to be set, Vb represents a maximum value of them, and $Vc_{max}$ represents a maximum value of the voltage values between both terminals of the capacitor that is calculated using $\int Ic\, dt$ that represents the integral value of the current Ic to a time when the current Ic flowing through the output terminal 150C becomes zero in the settings of (b) in FIG. 7 to FIG. 9.

If the relation of Va<$Vc_{max}$<Vb is satisfied in all of the configurations, the setting is selected in which a time to $Vc_{max}$ is shortest. In contrast, if the relation of $Vc_{max}$<Va is satisfied in all of the settings, the setting illustrated in (b) of FIG. 8 is selected. If the relation of Vb<$Vc_{max}$ is satisfied in all of the settings, the setting illustrated in (b) of FIG. 9 is selected.

If the setting illustrated in (b) of FIG. 7 is selected, the control unit 110C switches the semiconductor switches 210C to 2120C between the conduction states and the non-conduction states in order of (c) to (h) in FIG. 7. If the setting illustrated in (b) of FIG. 8 is selected, the control unit 110C switches the semiconductor switches 210C to 2120C between the conduction states and the non-conduction states in order of (c) to (h) in FIG. 8. If the setting illustrated in (b) of FIG. 9 is selected, the control unit 110C switches the semiconductor switches 210C to 2120C between the conduction states and the non-conduction states in order of (c) to (h) in FIG. 9.

In the switching output circuit in accordance with the present exemplary embodiment, the current flowing through the output terminal 150C is measured by the current monitor 400C, and the maximum value $Vc_{max}$ of the voltage between both terminals of the capacitor is calculated using ∫Ic dt that represents the integral value of the current Ic to a time when the current Ic flowing through the output terminal 150C becomes zero. Then any setting of the configurations of (b) in FIG. 7 to FIG. 9 is selected so that the relation of $Va<Vc_{max}<Vb$ may be satisfied, where Va represents a minimum value of the voltage value between both terminals of the capacitor to be set, Vb represents a maximum value of it. This makes it possible to regenerate the electromagnetic energy accumulated in the parasitic inductances 710C and 720C efficiently in the capacitors 310C to 340C in the shortest period of time, preventing an excessive voltage from being applied between the terminals of a semiconductor switch.

<A Fifth Exemplary Embodiment>

Figure 11:
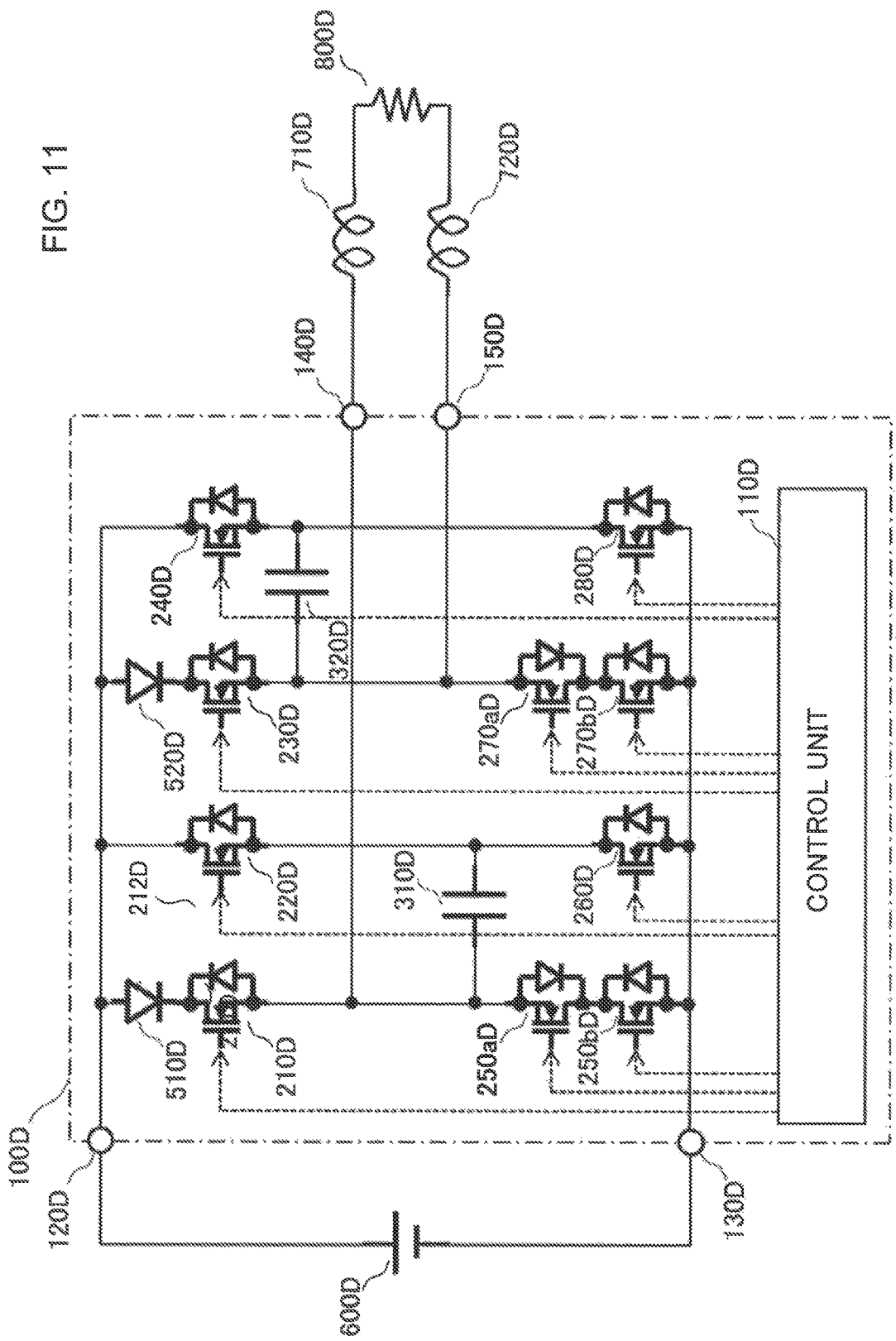
FIG. 11 is a circuit block diagram of a switching output circuit 100D in accordance with a fourth exemplary embodiment.

A fifth exemplary embodiment will be described. FIG. 11 illustrates a circuit block diagram of a switching output circuit in accordance with the present exemplary embodiment. A switching output circuit 100D switches power supplied through a direct-current power supply 600D and supplies the power to two parasitic inductances 710D, 720D, and a load resistance 800D. Here, the direct-current power supply 600D, the parasitic inductances 710D and 720D, and the load resistance 800D function as with the direct-current power supply 600, the parasitic inductances 710 and 720, and the load resistance 800 that are described in the second exemplary embodiment.

In FIG. 11, the switching output circuit 100D is configured by ten semiconductor switches 210D to 240D, 250aD, 250bD, 260D, 270aD, 270bD, and 280D, two capacitors 310D and 320D, and two diodes 510D and 520D. In addition, the switching output circuit 100D includes a control unit 110D, input terminals 120D and 130D, and output terminals 140D and 150D.

The semiconductor switches 210D to 240D, 250aD, 250bD, 260D, 270aD, 270bD, and 280D are configured by field effect transistors (FET) and diodes. For example, the semiconductor switch 210D is configured by a FET 211D and a diode 212D, and the drain of the FET 211D is connected to the cathode of the diode 212D, and the source of the FET 211D is connected to the anode of the diode 212D.

The semiconductor switches 210D, 230D, 250aD, 250bD, 270aD, and 270bD, and the diodes 510D and 520D compose a bridge-connection switching circuit. That is to say, each anode terminal of the diodes 510D and 520D is connected to the input terminal 120D. The cathode terminal of the diode 510D is connected to the drain terminal of the semiconductor switch 210D, and the cathode terminal of the diode 520D is connected to the drain terminal of the semiconductor switch 230D.

The source terminal of the semiconductor switch 250bD and the source terminal of the semiconductor switch 270bD are connected to the input terminal 130D, respectively.

The source terminal of the semiconductor switch 210D and the source terminal of the semiconductor switch 250aD are connected to the output terminal 140D respectively, and the source terminal of the semiconductor switch 230D and the source terminal of the semiconductor switch 270aD are connected to the output terminal 150D respectively. The drain terminal of the semiconductor switch 250aD is connected to the drain terminal of the semiconductor switch 250bD, and the drain terminal of the semiconductor switch 270aD is connected to the drain terminal of the semiconductor switch 270bD.

In contrast, the drain terminal of the semiconductor switch 220D and that of the semiconductor switch 240D are connected to the input terminal 120D respectively, and the source terminal of the semiconductor switch 260D and the source terminal of the semiconductor switch 280D are connected to the input terminal 130D respectively.

The source terminal of the semiconductor switch 240D and the drain terminal of the semiconductor switch 280D are connected to the output terminal 150D through the capacitor 320D. The source terminal of the semiconductor switch 220D and the drain terminal of the semiconductor switch 260D are connected to the output terminal 140D through the capacitor 310D.

In the switching output circuit 100D configured as described above, the control unit 110D switches the ten semiconductor switches between the conduction states and the non-conduction states in the procedures similar to those illustrated in (a) to (h) of FIG. 3 that are described in the second exemplary embodiment. The control unit 110D simultaneously switches the semiconductor switch 250aD and the semiconductor switch 250bD so that the both of them may become the same state that is one of the conduction state and the non-conduction state, and simultaneously switches the semiconductor switch 270aD and the semiconductor switch 270bD so that the both of them may become the same state that is one of the conduction state and the non-conduction state.

Figure 12:
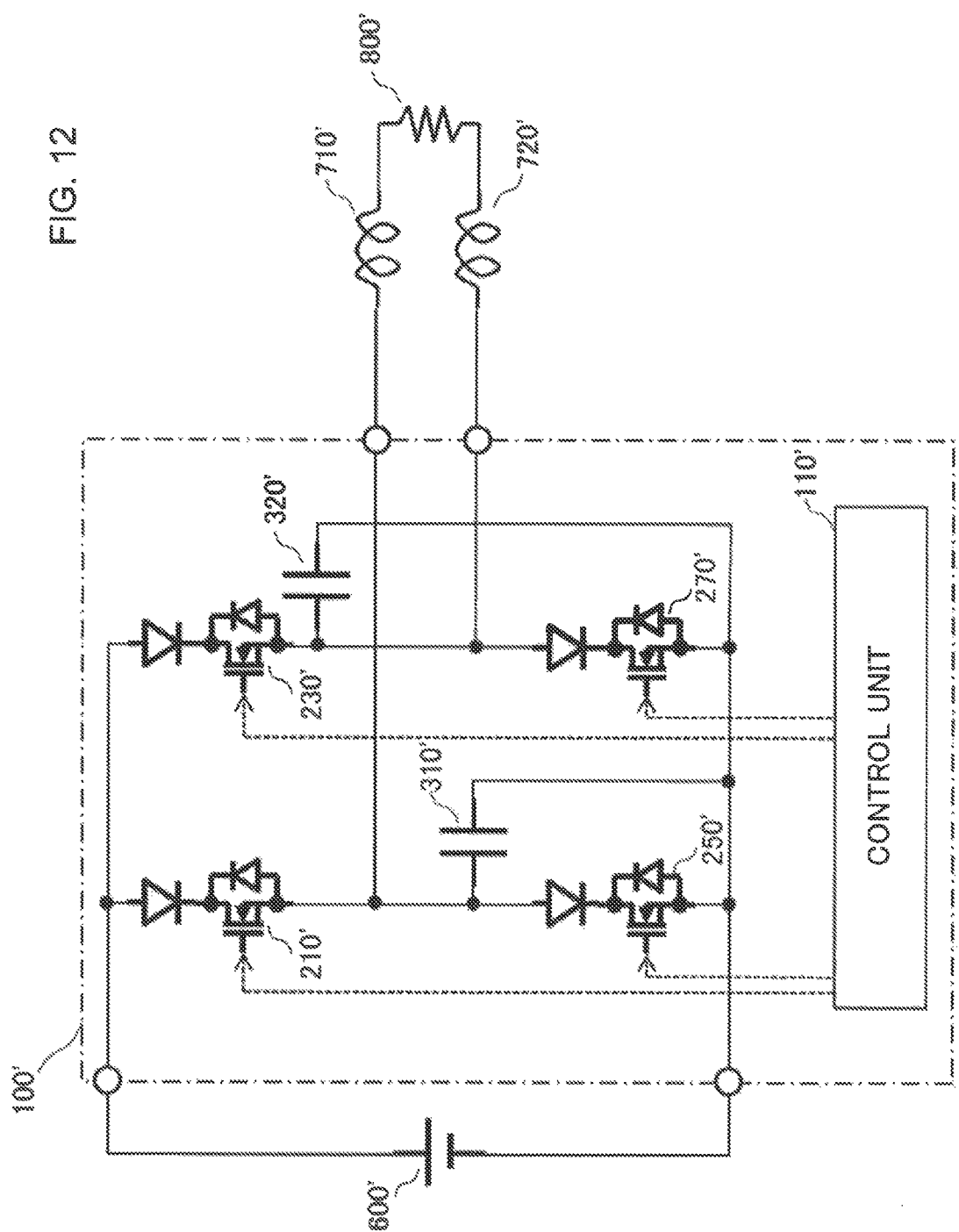
FIG. 12 is a circuit block diagram of a switching output circuit 100' in accordance with a comparative example.

The simulation results of the operation of the switching output circuit 100D as configured above will be described. As a comparative example, the simulation results of the operation of a switching output circuit will be also described that has no processes of (b), (d), (f), and (h) in FIG. 3. FIG. 12 illustrates a circuit block diagram of a switching output circuit in accordance with a comparative example, and FIG. 13 illustrates the operation procedures.

Figure 13:
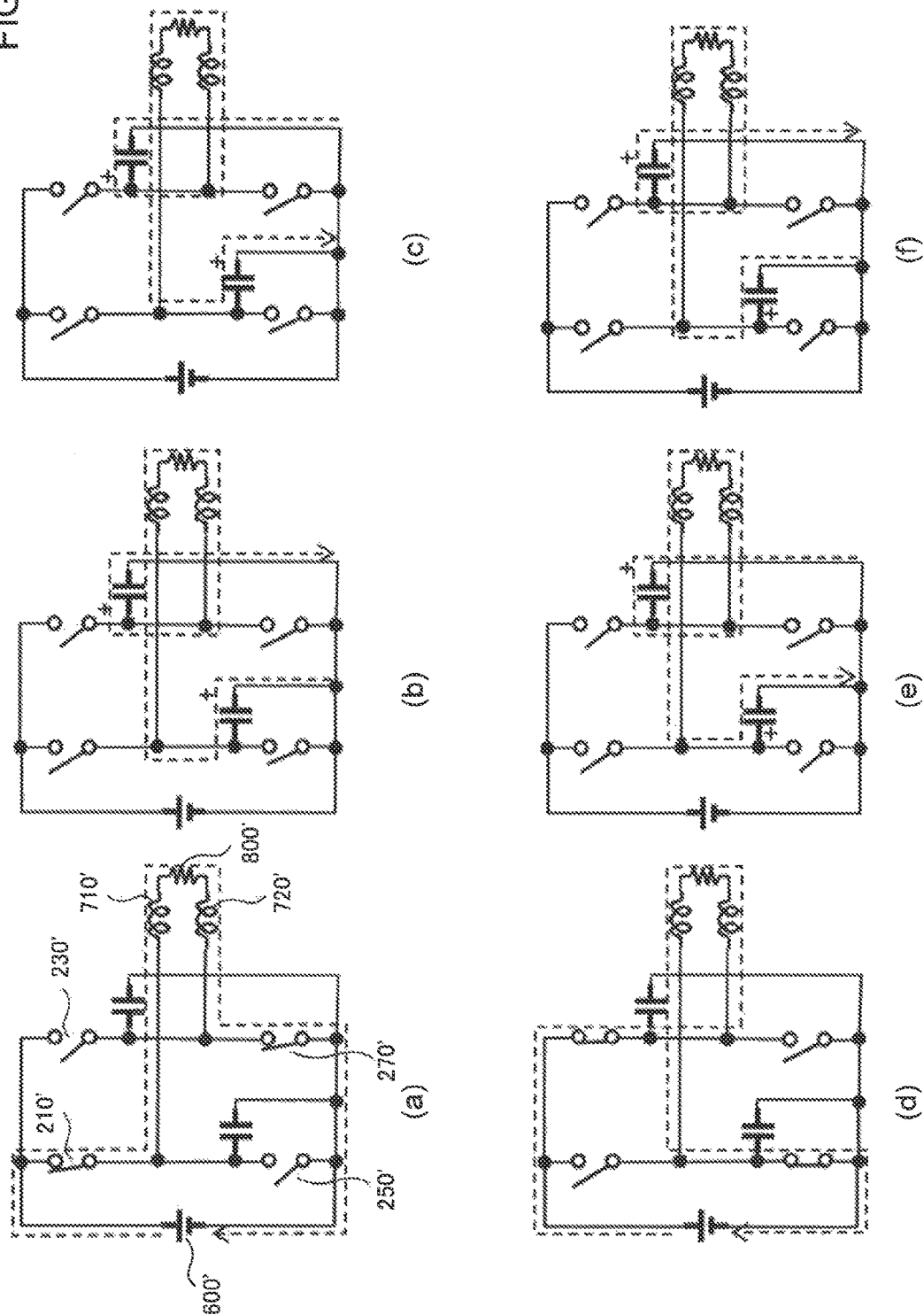
FIG. 13 is a diagram illustrating an operation procedure of the switching output circuit 100' in accordance with a comparative example.

A control unit 110' in a switching output circuit 100' illustrated in FIG. 12 switches the semiconductor switches 210' and 270' to the conduction states in (a) of FIG. 13 to accumulate the electromagnetic energy in the parasitic inductances 710' and 720', and then makes all of the semiconductor switches the non-conduction states, after that, moves to the state illustrated in (e) of FIG. 13. In (e) of FIG. 13, the semiconductor switches 230' and 250' are switched to the conduction states, the electromagnetic energy is accumulated in the parasitic inductances 710' and 720', and then all of the semiconductor switches are switched to the non-conduction states, after that, the state returns to that illustrated in (e) of FIG. 13.

In this case, after the capacitors 310 and 320 are charged until a current became zero in (b) and (e) of FIG. 13, a current flows in the opposite direction, which makes the voltage of the capacitors 310 and 320 become zero in (c) and (f) of FIG.13. That is to say, in (a) and (d) of FIG. 13, the electromagnetic energy in the parasitic inductances 710' and 720' is never regenerated.

Figure 14A:
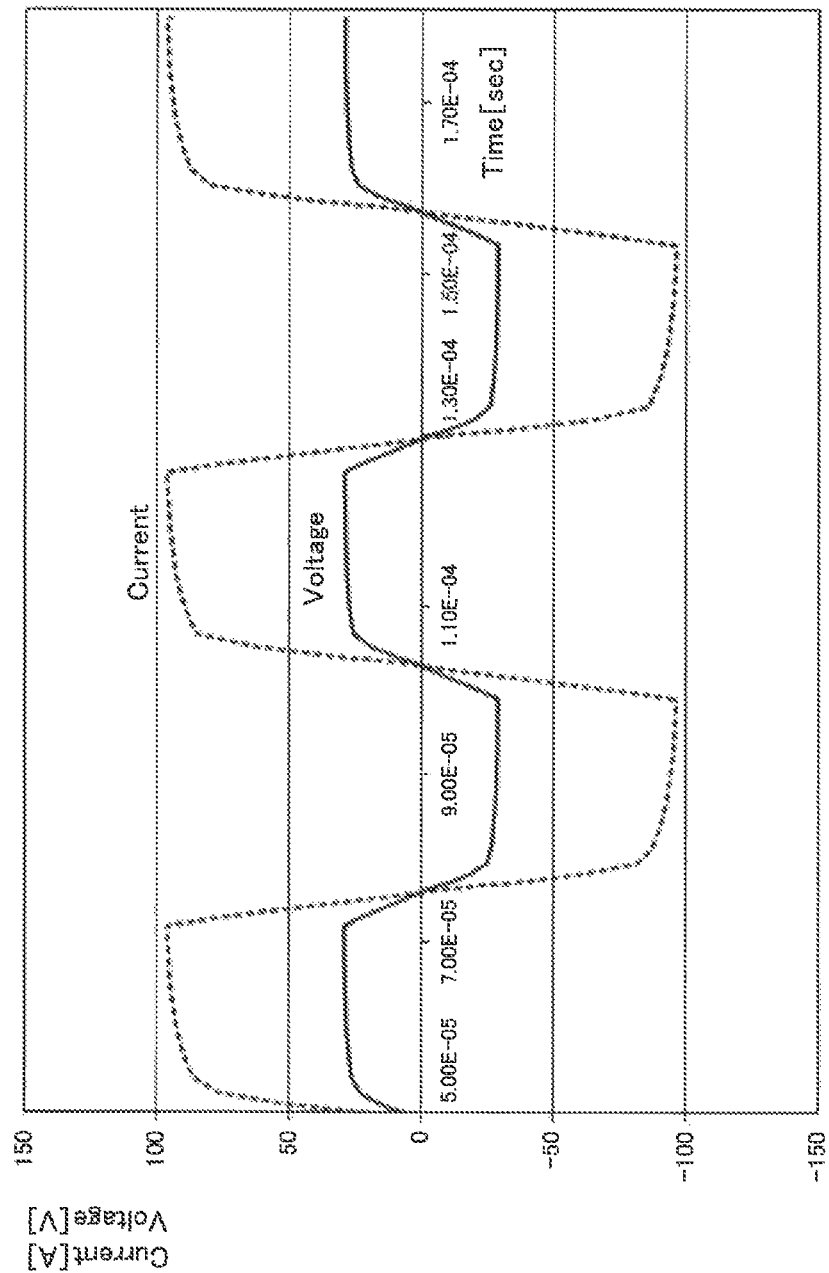
FIG. 14A is a graph illustrating simulation results of voltage between both terminals of a load resistance 800D and a current flowing through the load resistance 800D.
Figure 14B:
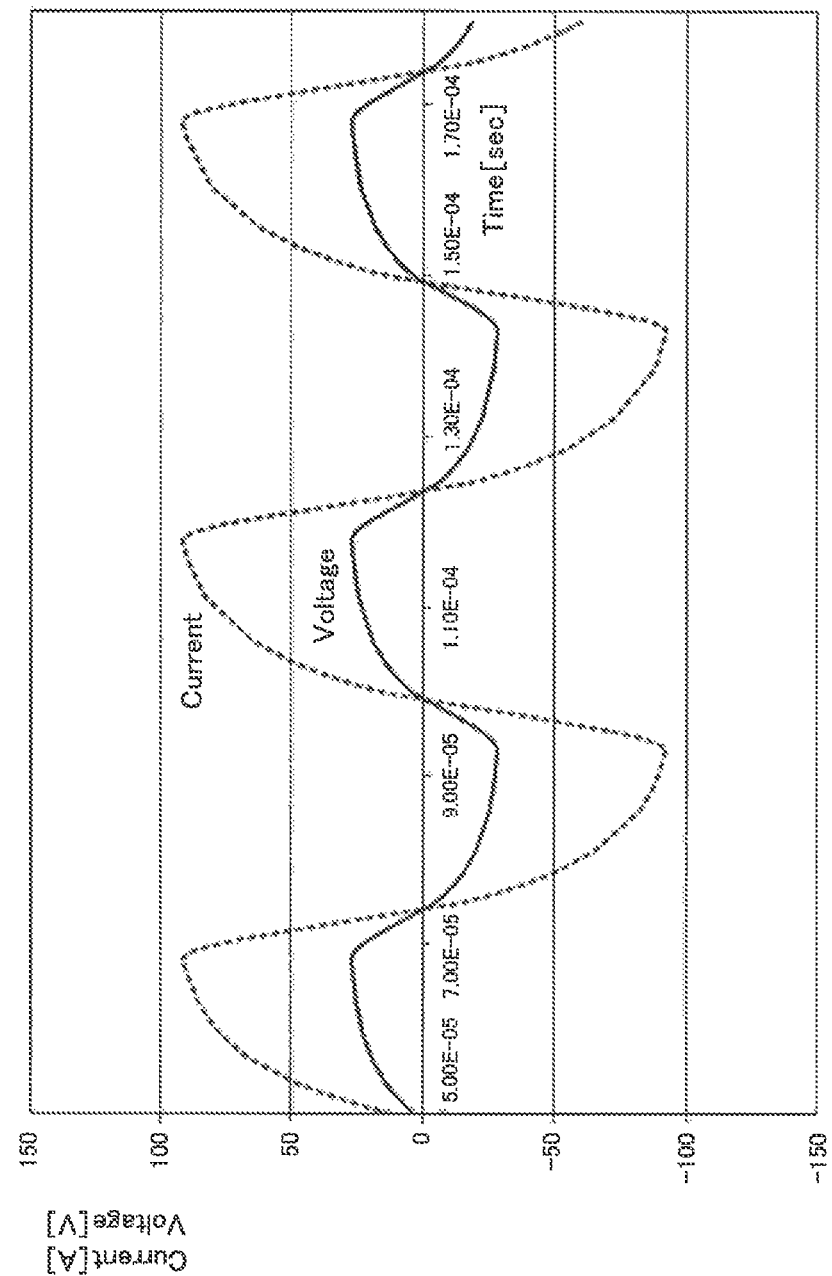
FIG. 14 B is a graph illustrating simulation results of voltage between both terminals of a load resistance 800' and a current flowing through the load resistance 800'.
Figure 15A:
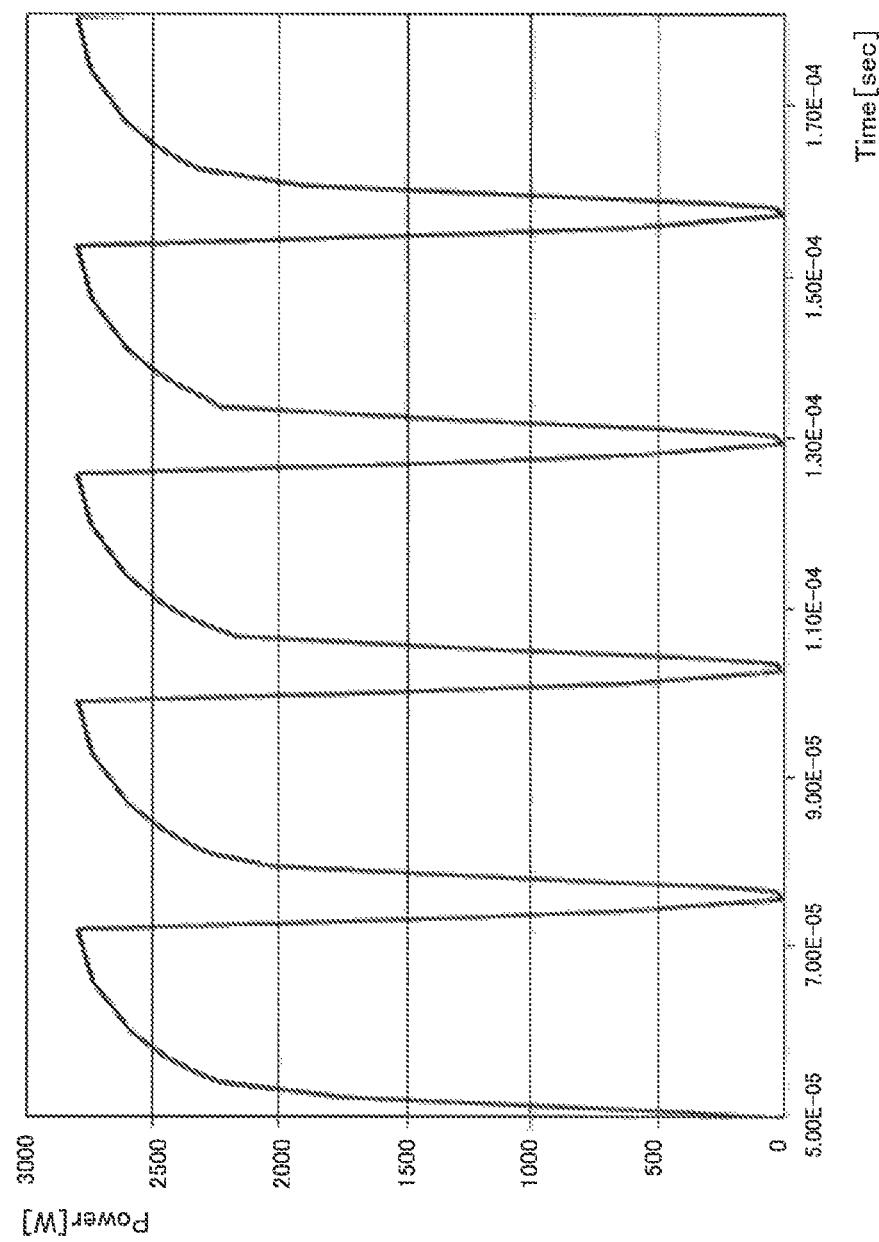
FIG. 15 A is a graph illustrating simulation results of power consumption in the load resistance 800D.
FIG. 15B is a graph illustrating simulation results of power consumption in the load resistance 800'.
Figure 15B:
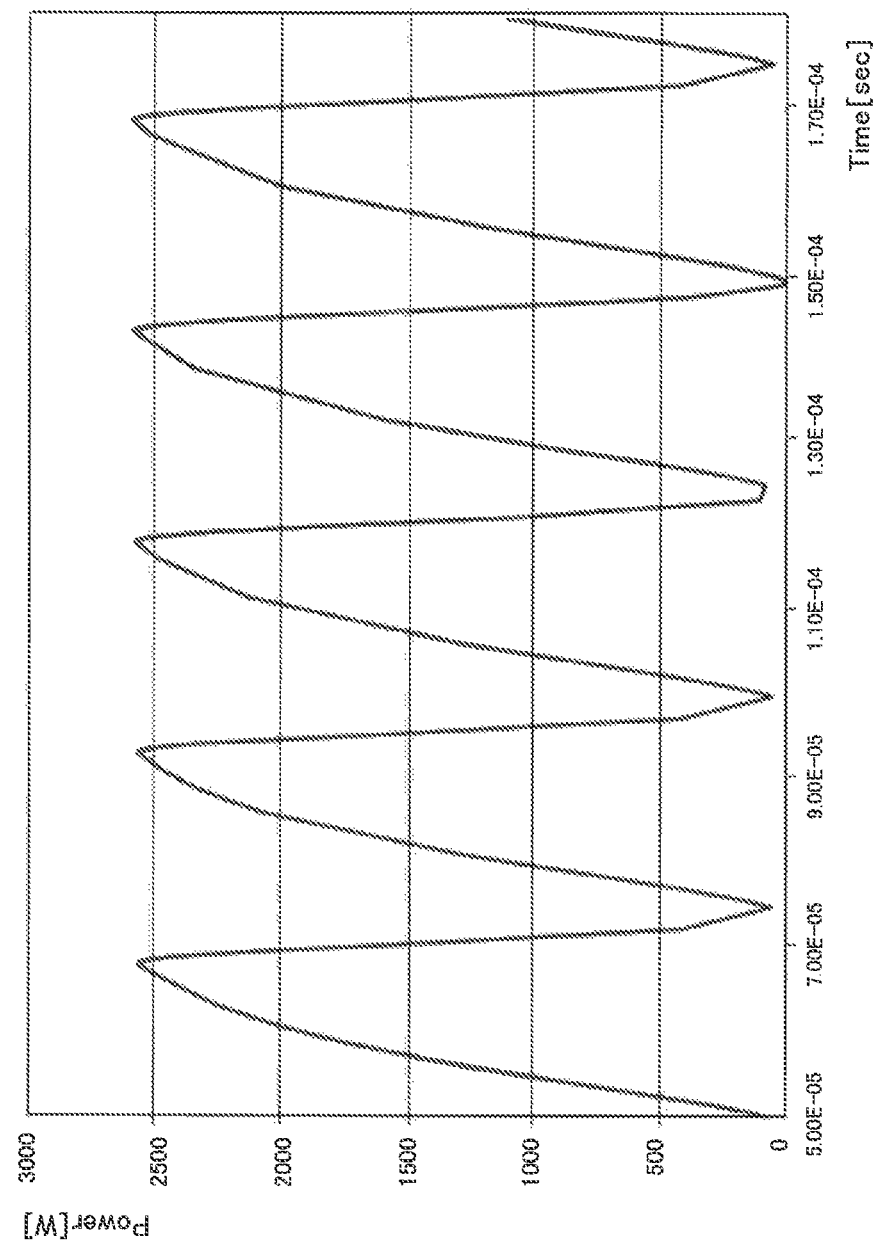
Figure 16:
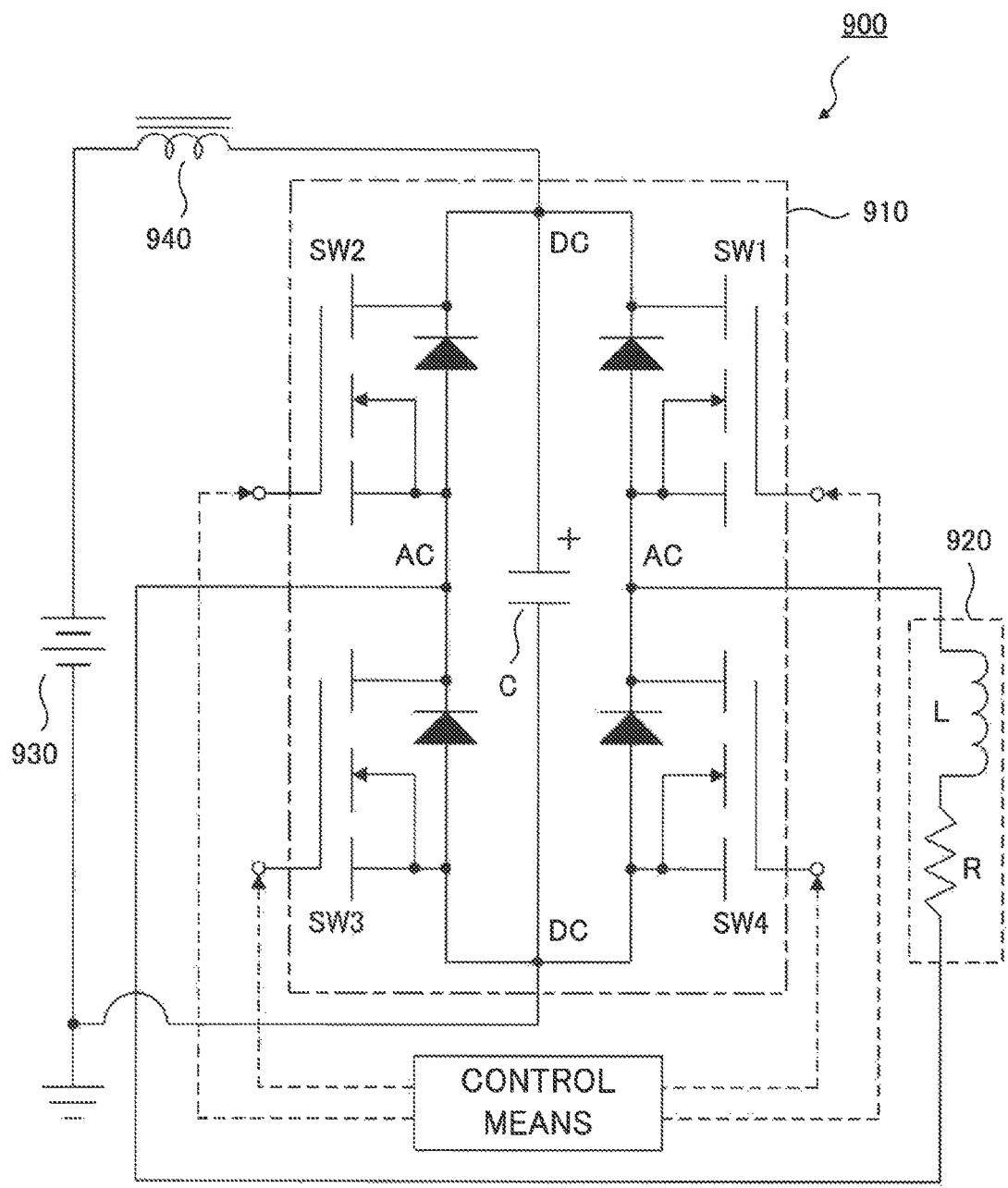
FIG. 16 is a circuit block diagram of a switching output circuit 900 in accordance with Patent Literature 1.

FIG. 14A illustrates the simulation results of the operation of the switching output circuit 100D in FIG. 11 in accordance with the present exemplary embodiment, and FIG. 14B illustrates the simulation results of the operation of the switching output circuit 100' in FIG. 12 n accordance with the comparative example. In FIG. 14A and FIG. 14B, a solid line represents voltages between both terminals of the load resistances 800D and 800', and a dotted line represents currents flowing through the load resistances 800D and 800'. FIG. 15A and FIG. 15B also illustrate power consumption of the load resistance 800D, 800' at that time. The simulation conditions are as follows: the voltage of the direct-current power supply 600D, 600' is 30V, the electrostatic capacitance of the capacitors 310D, 320D, 310', and 320' is 10 μF, the resistance value of the load resistances 800D and 800' is 0.3Ω, and the inductance of the parasitic inductances 710D, 720D, 710', and 720' is 1 μH. The control units 110D and 110' switch the semiconductor switches between the conduction states and the non-conduction states at 30 kHz.

As illustrated in FIG. 14B, with regard to the switching output circuit 100' in FIG. 12 in accordance with the comparative example, the leading edge of the current waveform flowing through the load resistance 800' deteriorates due to the parasitic inductances 710' and 720'. In contrast, as illustrated in FIG. 14A, with regard to the switching output circuit 100D in FIG. 11 in accordance with the present exemplary embodiment, the surge voltage due to the parasitic inductances 710D and 720D is regenerated thorough the capacitors 310D and 320D, which makes it possible to improve the leading edge of the current waveform flowing through the load resistance 800D.

In FIG. 15B, an average power consumption is equal to 1520 W in the load resistance of the switching output circuit 100' in FIG. 12 in accordance with the comparative example. In contrast, in FIG. 15A, an average power consumption is equal to 2120 W in the load resistance of the switching output circuit 100D in FIG. 11 in accordance with the present exemplary embodiment. Thus, the switching output circuit 100D in accordance with the present exemplary embodiment supplies the load resistance with electric power increased by about 39% as compared to the switching output circuit 100' in FIG. 12 in accordance with the comparative example.

The present invention is applicable to use applications such as PWM control type switching output circuits and PWM control type switching output devices that supply electric power to a load. The present invention is not limited to the above exemplary embodiments and includes any design modification without departing from the spirit of the invention.

INDUSTRIAL APPLICABILITY

The present invention is widely applicable to switching output circuits that supply electric power to a resistive load having a parasitic inductance.

This application is based upon and claims the benefit of priority from Japanese patent application No. 2014-124980, filed on Jun. 18, 2014, the disclosure of which is incorporated herein in its entirety by reference.

REFERENCE SIGNS LIST

10 switching output circuit
21 to 28 switching member
31, 32 electric storage member
40 inductive load
50 direct-current power supply
100 switching output circuit
110 control unit
120, 130 input terminal
140, 150 output terminal
210 to 280 semiconductor switch
310, 320 capacitor
400 current monitor
410, 420 voltage monitor
600 direct-current power supply
710, 720 parasitic inductance
800 load resistance
900 switching output circuit
910 switching unit
920 load
930 direct-current power supply
940 smoothing coil

The invention claimed is:

1. A switching output circuit to switch power supplied from a direct-current power supply and supply the power to an inductive load, comprising:
twelve switching units, four capacitors, and a control unit,
wherein each one end of first, second, third, and fourth switching units is connected to a positive terminal of the direct-current power supply, and each other end of fifth, sixth, seventh, and eighth switching units is connected to a negative terminal of the direct-current power supply,
wherein the other end of the first switching unit and one end of the fifth switching unit are connected to one end of the inductive load, and the other end of the third switching unit and one end of the seventh switching unit are connected to the other end of the inductive load,
wherein the other end of the second switching unit and one end of the sixth switching unit are connected to one end of the inductive load through the first capacitor, and the other end of the fourth switching unit and one end of the eighth switching unit are connected to the other end of the inductive load through the second capacitor,
wherein each one end of ninth and tenth switching units is connected to the positive terminal of the direct-current power supply,
wherein other end of the ninth switching unit and one end of the eleventh switching unit is connected to one end of the inductive load through the third capacitor, and the other end of the tenth switching unit and one end of the twelfth switching unit is connected to the other end of the inductive load through the fourth capacitor,
wherein the other end of the eleventh switching unit and the other end of the twelfth switching unit is connected to the negative terminal of the direct-current power supply, and
wherein the control unit controls the first to the twelfth switching units and switches a conduction state and a non-conduction state by sequentially performing:
a first control to make the first and the seventh switching units, or the third and the fifth switching units, conduction states, with making the other switching units non-conduction states,
a second control, depending on the first control, to control the sixth and the eighth switching units, or the eleventh and the twelfth switching units, or the sixth, the eighth, the eleventh, and the twelfth switching units to make them conduction states, with making the other switching units non-conduction states,
a third control to make all of the switching units non-conduction states, and
a fourth control, depending on the first and second control, to control the fourth and the sixth switching units, or the second and the eighth switching units, or the tenth and the eleventh switching units, or the ninth and the twelfth, or the fourth, the sixth, the tenth, and the eleventh switching units, or the second, the eighth, the ninth, and the twelfth switching units, to make them conduction states, with making the other switching units non-conduction states.

2. The switching output circuit according to claim 1, further comprising
first and second voltage measurement units configured to measure respectively voltage values between both terminals of the first and the second capacitors,
wherein the control unit moves from the second control to the third control when a measurement of the first or the second voltage measurement unit has become maximum.

3. The switching output circuit according to claim 2, wherein the first, the third, the fifth, and the seventh switching units compose a bridge-connection switching circuit.

4. The switching output circuit according to claim 1, further comprising
a current measurement unit configured to measure a current value flowing away from the inductive load, disposed in a stage following the inductive load and,
wherein the control unit moves from the second control to the third control when a current flowing away from the inductive load has become zero.

5. The switching output circuit according to claim 4, wherein the first, the third, the fifth, and the seventh switching units compose a bridge-connection switching circuit.

6. The switching output circuit according to claim 1, further comprising
first to fourth voltage units configured to measure respectively voltage values between both terminals of the first to fourth capacitors,
wherein
when a capacitance of the first and the second capacitors is C1, and a capacitance of the third and the fourth capacitors is C2(<C1),
the control unit, as a second control, selects a combination in which |Vc−Vc'|/Vc is minimized, where Vc is a voltage between both terminals of the capacitor after a period Tr, and Vc' is a voltage between both terminals of the capacitor one sampling time before Tr.

7. The switching output circuit according to claim 6, wherein the first, the third, the fifth, and the seventh switching units compose a bridge-connection switching circuit.

8. The switching output circuit according to claim 1, further comprising
a current measurement unit configured to measure a current value flowing away from the inductive load, disposed in a stage following the inductive load and, wherein
when a capacitance of the first and the second capacitors is C1, and a capacitance of the third and fourth capacitors is C2(<C1),
the control unit, as a second control, selects a combination in which (Ic−Ic') is made negative and |Ic| is minimized, where Ic is a current value flowing through an output terminal after a period Tr, and Ic' is a current value flowing through the output terminal one sampling time before Tr.

9. The switching output circuit according to claim 8, wherein the first, the third, the fifth, and the seventh switching units compose a bridge-connection switching circuit.

10. The switching output circuit according to claim 1, further comprising
first to fourth voltage measurement units configured to measure respectively voltage values between both terminals of the first to fourth capacitors,
wherein
when Va is a minimum value, Vb is a maximum value, within a predetermined range of voltage value between both terminals of capacitor to be set, and $Vc_{max}$ is a maximum value of voltage between both terminals of the capacitor,
the control unit, as a second control, selects a combination in which a relation of $Va<Vc_{max}<Vb$ is satisfied.

11. The switching output circuit according to claim 10, wherein the first, the third, the fifth, and the seventh switching units compose a bridge-connection switching circuit.

12. The switching output circuit according to claim 1, further comprising
a current measurement unit configured to measure a current value flowing away from the inductive load, disposed in a stage following the inductive load,
wherein the control unit, as a second control, selects a combination in which a relation of $Va<Vc_{max}<Vb$ is satisfied, where Va is a minimum value, Vb is a maximum value, within a predetermined range of voltage value between both terminals of capacitor to be set, and $Vc_{max}$ is a maximum value of voltage between both terminals of capacitor calculated using $\int Ic\, dt$ that is an integral value of current Ic to a time when measured current value becomes zero.

13. The switching output circuit according to claim 12, wherein the first, the third, the fifth, and the seventh switching units compose a bridge-connection switching circuit.

14. The switching output circuit according to claim 1, wherein the first, the third, the fifth, and the seventh switching units compose a bridge-connection switching circuit.

15. The switching output circuit according to claim 1, wherein the first, the third, the fifth, and the seventh switching units compose a bridge-connection switching circuit.

16. The switching output circuit according to claim 1, wherein the first, the third, the fifth, and the seventh switching units compose a bridge-connection switching circuit.

* * * * *